United States Patent [19]
Shimamoto et al.

[11] Patent Number: 6,133,094
[45] Date of Patent: Oct. 17, 2000

[54] SEMICONDUCTOR DEVICE AND PROCESS OF PRODUCING THE SAME

[75] Inventors: Hiromi Shimamoto, Tachikawa; Takashi Uchino, Kokubunji; Takeo Shiba, Kodaira; Kazuhiro Ohnishi, Hachiohji; Yoichi Tamaki; Takashi Kobayashi, both of Kokubunji; Toshiyuki Kikuchi, Ome; Takahide Ikeda, Tokorozawa, all of Japan

[73] Assignees: Hitachi Ltd, Tokyo; Hitachi Device Engineering Co., Chiba, both of Japan

[21] Appl. No.: 09/123,405

[22] Filed: Jul. 28, 1998

Related U.S. Application Data

[62] Division of application No. 08/519,096, Aug. 24, 1995, Pat. No. 5,793,097, which is a continuation of application No. 08/207,132, Mar. 7, 1994, abandoned.

[30] Foreign Application Priority Data

Mar. 9, 1993 [JP] Japan .................................. 5-047730

[51] Int. Cl.$^7$ .................................................. H01L 21/336
[52] U.S. Cl. .................... 438/261; 438/382; 438/238; 438/263; 438/264; 438/257; 438/262
[58] Field of Search .................... 438/382, 238, 438/263, 264, 257, 261, 262

[56] References Cited

U.S. PATENT DOCUMENTS

| | | | |
|---|---|---|---|
| 5,093,700 | 3/1992 | Sakata | 357/23.1 |
| 5,130,264 | 7/1992 | Troxell et al. | 437/40 |
| 5,168,075 | 12/1992 | Kuo | 437/52 |
| 5,204,276 | 4/1993 | Nakajima et al. | 437/31 |
| 5,349,494 | 9/1994 | Ando | 257/532 |
| 5,434,438 | 7/1995 | Kuo | 257/300 |
| 5,506,737 | 4/1996 | Lin et al. | 360/121 |
| 5,614,746 | 3/1997 | Hong et al. | 257/316 |
| 5,840,607 | 11/1998 | Yeh et al. | 438/257 |
| 5,888,870 | 3/1999 | Gardner et al. | 438/261 |
| 5,960,285 | 9/1999 | Hong | 438/264 |

FOREIGN PATENT DOCUMENTS

| | | |
|---|---|---|
| 5552252 | 4/1980 | Japan . |
| 58-6598 | 1/1983 | Japan . |
| 58-42264 | 3/1983 | Japan . |
| 58-225648 | 12/1983 | Japan . |
| 233967 | 2/1990 | Japan . |
| 330363 | 2/1991 | Japan . |
| 3166757 | 7/1991 | Japan . |
| 4145657 | 5/1992 | Japan . |
| 4170064 | 6/1992 | Japan . |

Primary Examiner—Matthew Smith
Assistant Examiner—V. Yevsikov
Attorney, Agent, or Firm—Antonelli, Terry, Stout & Kraus, LLP

[57] ABSTRACT

The present invention provides a polycrystalline silicon conducting structure (e.g., a resistor) whose resistance value is controlled, and can be less variable and less dependent on temperature with respect to any resistant value, and a process of producing the same. Use is made of at least a two-layer structure including a first polycrystalline silicon layer of large crystal grain size and a second polycrystalline silicon layer of small crystal grain size, and the first polycrystalline silicon layer has a positive temperature dependence of resistance while the second polycrystalline layer has a negative temperature dependence of resistance, or vice versa. Moreover, the polycrystalline silicon layer of large grain size can be formed by high dose ion implantation and annealing, or by depositing the layers by chemical vapor deposition at different temperatures so as to form large-grain and small-grain layers.

10 Claims, 30 Drawing Sheets

SEMICONDUCTOR DEVICE AND PROCESS OF PRODUCING THE SAME

This application is a Divisional application of application Ser. No. 08/519,096, filed Aug. 24, 1995 now U.S. Pat. No. 5,793,097, the contents of which are incorporated herein by reference in their entirety, which application Ser. No. 08/519,096 is a Continuation application of application Ser. No. 08/207,132, filed Mar. 7, 1994 now abandoned.

BACKGROUND OF THE INVENTION

The present invention relates to a semiconductor device using polycrystalline silicon resistors having only a small resistance value deviation, and whose resistance varies with a change in temperature at a desired level (including wherein the resistance value is substantially independent of a change in temperature), e.g., in the temperature range of use of the device.

With respect to the prior art concerned with resistors using polycrystalline silicon, *IEEE Transactions on Electron Devices,* ED-28, No. 7 (1981), pp. 818–830, and Gray and Meyer, *Analysis and Design of Analog Integrated Circuits,* 2d Ed. (1984), John Wiley & Sons, Inc. disclose an arrangement of making one of the following a resistor, namely, (1) an impurity diffusion region in a semiconductor substrate, and (2) a polycrystalline silicon layer on a dielectric film. FIGS. 20–22 of the present application are sectional views of these structures, wherein numeral 1 denotes a silicon substrate (e.g., monocrystalline silicon), 2 and 4 silicon dioxide films, 3a a polycrystalline silicon layer of small grain size, 3b a polycrystalline silicon layer of large grain size, 7 an aluminum electrode, and 8 a P-type impurity diffusion region.

However, the resistance value of a resistor using polycrystalline silicon drastically varies with temperature, in a temperature range of use of the resistor (e.g., −20° C. to 150° C.), and this poses a serious problem in designing circuits in a case where the resistors of that sort are employed in integrated circuits.

In order to meet the situation above, (1) Japanese Patent Laid-Open Nos. 182259/1983, 74466/1985 and 116160/1985 disclose method of controlling polycrystalline grain size; (2) Japanese Patent Laid-Open No. 263367/1991 discloses the use of polycrystalline silicon containing impurities whose temperature coefficient of resistance in the high concentration area is positive and negative, whereas Japanese Patent Laid-Open No. 285668/1990 discloses a method of forming a state in a silicon bandgap by irradiating the polycrystalline silicon with charged particles; (3) Japanese Patent Laid-Open Nos. 191062/1986 and 268462/1990 disclose a method of coupling a polycrystalline silicon resistor layer having a negative temperature coefficient to a single-crystal silicon region (in a substrate) having a positive temperature coefficient, in series or parallel; and (4) Japanese Patent Laid-Open No. 51957/1986 discloses an arrangement of making a resistor from a polycrystalline silicon film and a doped region in a silicon member, the resistor including a polycrystalline silicon film and single crystal silicon.

The foregoing disclosed structures have problems in providing resistors of desired resistance values and with no (or substantially no) temperature dependence of resistance over the temperature range of use of the resistor. For example, where only a single layer or single region is used, it is difficult to both control the resistance value to a desired value, and to provide a temperature dependence of resistance that is substantially zero. Moreover, fabrication difficulties arise, or the manufacturing is made more complex, by electrically connecting a semiconductor region in, e.g., a single-crystal silicon substrate to a polycrystalline silicon layer (either by forming the polycrystalline silicon directly on the semiconductor region or electrically connecting an overlying polycrystalline silicon layer to a region in a single-crystal silicon substrate).

Moreover, in the methods discussed above the temperature dependence of such a resistor that uses polycrystalline silicon needs to be improved with respect to a specific resistance value. However, the improvement of the temperature dependence with respect to any given specific resistance value cannot technically be provided, and this means different processes of manufacture will have to be adopted for different resistance values of different resistors, even where the different resistors are on a same substrate of a same semiconductor device.

Moreover, there arises a problem in that polycrystalline silicon resistors different in resistance value are difficult to form on one and the same substrate. In other words, a method of manufacturing extremely small polycrystalline silicon resistors excellent in temperature dependence remains nonexistent. The method of (1), with reference to Japanese Patent Laid-Open No. 182259/1993, as noted previously, for example, has disadvantages including a poor affinity between the process and other resistors because the grain size is controlled by heat treatment, and difficulties arise in simultaneously improving temperature dependence of at least two resistors which are different in resistivity. In the case of the method with reference to Japanese Patent Laid-Open No. 74466/1985, a shortcoming is that the number of process steps increases as laser annealing and hydrogen plasma treatment are added, simultaneously with the limitation of heat treatment after the formation of resistance. As for the method with reference to Japanese Patent Laid-Open No. 116160/1985, a shortcoming lies in the fact that the temperature dependence is determined by, for example, resistivity, and that the effect of improvement is attainable only at high resistivity. Further, the method of (2), with reference to Japanese Patent Laid-Open No. 263367/1991, as noted above, has a disadvantage in poor processing stability because the segregation coefficient is affected by impurity concentration and the history of heating the resistor. Regarding the method with reference to Japanese Patent Laid-Open No. 285668/1990, a shortcoming includes the necessity of introducing crystal defects into polycrystalline silicon with excellent controllability, and its applicability to only high resistivity with a greater resistance component on the grain boundary. The method of (3) also poses such problems that (a) since two kinds of resistors are connected together via an electrode, deviation of characteristics tends to increase in comparison with the use of a single resistor, because deviation in resistance becomes equal to the sum of deviations of characteristics of both resistors, and (b) not only the number or process steps but also the area occupied thereby increases. Further, the method of (4) is disadvantageous in that since a laser beam is used to cause liquid phase epitaxial growth, the physical position of a resistor is restricted, and this makes difficult the industrial application of this method to LSIs.

SUMMARY OF THE INVENTION

A first object of the present invention is to provide a polycrystalline silicon conducting structure whose temperature dependence of resistance is a desired value, e.g., over a temperature range of operation of the structure, with respect to any given resistance value, and a method of making the conducting structure.

Another object of the present invention is to provide a polycrystalline silicon conducting structure (e.g., a resistor) having a desired temperature dependence of resistance, and having a desired resistance value, and a method of making such conducting structure.

Still another object of the present invention is to provide a polycrystalline silicon conducting structure whose temperature dependence of resistance is substantially zero, e.g., over a temperature range of operation of the structure, with respect to any given resistance value, and a method of manufacturing such conducting structure.

Still another object of the present invention is to provide a polycrystalline silicon conducting structure (e.g., a resistor) having a substantially zero temperature dependence of resistance over a temperature range of operation of the conducting structure, and having a desired resistance value, and a method of manufacturing such conducting structure.

Still another object of the present invention is to provide a polycrystalline silicon conducting structure having a plurality of conducting elements (e.g., a plurality of resistors, a resistor and a base lead-out (of a bipolar transistor), a base lead-out and an emitter lead-out (each of a bipolar transistor), etc.), wherein at least one of the conducting elements has a resistance value different from that of others of the conducting elements, and wherein the conducting elements (e.g., each of the conducting elements) have a temperature dependence of resistance that is a desired value (e.g., substantially zero), and a method of manufacturing the conducting structure.

Still another object of the present invention is to provide a conducting structure made of at least two layers of polycrystalline silicon, and having a desired resistance value, and also having a temperature coefficient of resistance that is a desired value (e.g., substantially zero), and a method of manufacturing the conducting structure.

Still another object of the present invention is to provide a conducting structure made solely of layers of polycrystalline silicon (e.g., made solely of at least two layers of polycrystalline silicon), and which has a desired resistance value, yet which has, e.g., a substantially zero temperature dependence of resistance.

Still another object of the present invention is to provide a polycrystalline silicon resistor having not only small resistance value deviation but also a small temperature dependence of resistance, and a process of producing the same.

Still another object of the present invention is to provide a process of forming an extremely small resistor, having a small temperature dependence of resistance, and which is stable, using polycrystalline silicon.

The above objects can be accomplished by, for example, making a polycrystalline silicon film of a two-layer structure including, as shown in FIG. 2, a first polycrystalline silicon layer 3a having a negative temperature dependence (i.e., resistivity decreasing as the temperature rises) and a second polycrystalline silicon layer 3b having a positive temperature dependence (i.e., resistivity increasing as the temperature rises). Further, the two-layer polycrystalline silicon film can be produced by providing a polycrystalline silicon film deposited at 600° C. or higher, so as to have a relatively small grain size, and forming part of the thickness of the polycrystalline silicon film with a relatively large crystal grain size by doping with impurities by ion implantation, so as to form an amorphous layer, and then annealing to form relatively large crystals.

Alternatively, the two-layer polycrystalline silicon film can be produced by forming each of the two layers of the polycrystalline silicon film by chemical vapor deposition, one of the two layers being deposited at a temperature greater than 600° C. and the other of the two layers being deposited at a temperature less than 600° C. Deposition at the different temperatures will form a layer with crystals of a relatively large size and a layer with crystals of a relatively small size, having respectively a positive temperature dependence of resistance and a negative temperature dependence of resistance, so as to provide structure (the polycrystalline silicon film) whose resistance is substantially independent of temperature over the range of temperatures at which the structure is used.

Thus, the objects of the present invention are achieved by combining at least two polycrystalline silicon layers that are different in temperature dependence of resistance, including wherein the at least two layers have different impurity concentration and/or are of different material quality.

It is important, with respect to one aspect of the present invention, that the conducting structure (e.g., resistor) include at least two layers of polycrystalline silicon, including a first layer with a positive temperature dependence of resistance and a second layer with a negative temperature dependence of resistance, so as to, desirably, achieve a conducting structure having a temperature dependence of resistance that is substantially zero (i.e., whose resistance is substantially independent of temperature).

The at least two layers desirably achieve a net of zero variation of resistance due to change of temperature, while achieving a desired resistance value for the conducting structure. When using the aforementioned ion implantation technique to form the different polycrystalline silicon layers, both the change in crystal grain size in a partial thickness of the polycrystalline silicon film, and the increased impurity concentration in the ion-implanted partial thickness, each cause a change in the temperature dependence of resistance (so as to change the ion-implanted layer to have a positive temperature dependence of resistance). Moreover, the larger crystal grains, and greater impurity concentration, will also change the resistance value of the conducting structure, so that a desired resistance value of the conducting structure can be provided.

The present invention is particularly effective when there are resistors having different values of resistance on a same substrate; the present invention can be used to provide the desired different resistance values, while achieving resistors whose resistance values are substantially independent of temperature. For example, masking and/or local ion implantation can be used to selectively implant different resistors with different implant doses and under different energy levels, so as to achieve the objectives of the present invention. Prior methods of controlling temperature dependence of resistance cannot be used where resistors having different resistance values are provided on the same substrate.

The present invention also provides a conducting structure (e.g., a resistor) having any desired temperature dependence, e.g., by the above-discussed ion implantation. The temperature dependence is improved by combining together at least two kinds of resistance layers different in temperature dependence, so as to form a resistor having any desired (predetermined) temperature dependence. As a result, temperature compensation of a resistance value is facilitated in designing circuits. Since a resistor can be positioned optionally with respect to an element having a large calorific value, moreover, the freedom of layout is enhanced, whereby operation in a wider temperature range can be made possible.

As seen from the foregoing, the present invention contemplates conducting structure having at least two polycrystalline silicon layers of different temperature dependence of resistance, so as to provide the conducting structure with a desired temperature dependence of resistance (including a temperature dependence of resistance that is substantially zero). The conducting structure can include other conducting elements (such as other resistors), with the sum of temperature dependence of resistance of all elements of the conducting structure being a desired value (e.g., substantially zero).

Accordingly, by the present invention a conducting structure, formed of polycrystalline silicon layers, can be provided, having a desired resistance value and a desired temperature dependence of resistance (including a temperature dependence of resistance that is substantially zero over a temperature range of use of the conducting structure, e.g., −20° C. to +150° C. ). Such conducting structure can easily be manufactured, e.g., by deposition and ion implantation, or by chemical vapor deposition of two polycrystalline silicon layers at different temperatures.

DETAILED DESCRIPTION OF THE INVENTION

In the following, the present invention will be described in terms of specific and preferred embodiments. However, the present invention is not limited to these specific and preferred embodiments, it being intended that the present invention cover all alterations, modifications and equivalents as may be included within the spirit and scope of the claims forming part of this disclosure.

Referring to test data, a detailed description of the present invention will be given in the following.

Figure 13:
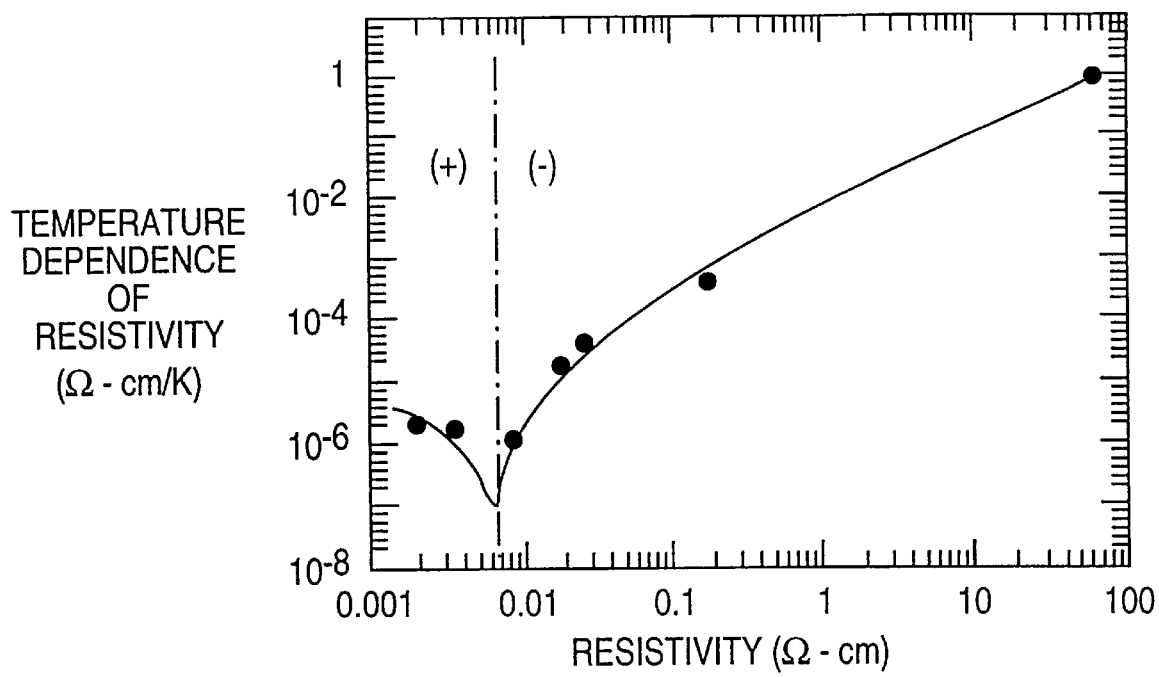
FIG. 13 is a graph of experimental data showing temperature dependence of resistance of a polycrystalline silicon resistor as a function of resistivity.

Due to the presence of the grain boundary in the polycrystalline silicon, the electrical characteristics greatly vary with the impurity concentration, activation yield and crystal structure of the polycrystalline silicon. FIG. 13 shows a relation between the resistivity of polycrystalline silicon and temperature dependence of resistance. The test results may be described as follows: The resistance component of polycrystalline silicon is the sum of the resistance component originating from the potential barrier produced by carrier depletion on the grain boundary interface and the resistance component of the single crystal silicon within the grain boundary. Therefore, the temperature dependence of the polycrystalline silicon is the sum of the resistance component on the grain boundary interface, which is negative in temperature dependence, and the single crystal silicon component, which is positive in temperature dependence. Consequently, the width of the depletion layer increases when the carrier concentration is reduced and the potential barrier becomes greater, whereas the resistor exhibits a negative temperature dependence of resistance. When the carrier concentration is increased, on the other hand, the width of the depletion layer decreases to the extent that it is ignorable, and the most part of the polycrystalline silicon may be considered as a single crystal area, so that, like the single crystal silicon, the resistor exhibits a positive temperature dependence of resistance. The temperature dependence of the polycrystalline silicon is made thus controllable by varying the carrier concentration.

With respect to the method of controlling the carrier concentration, an ion implantation technique is most common, and is also controllable readily and accurately in comparison with other ones.

Figure 14:
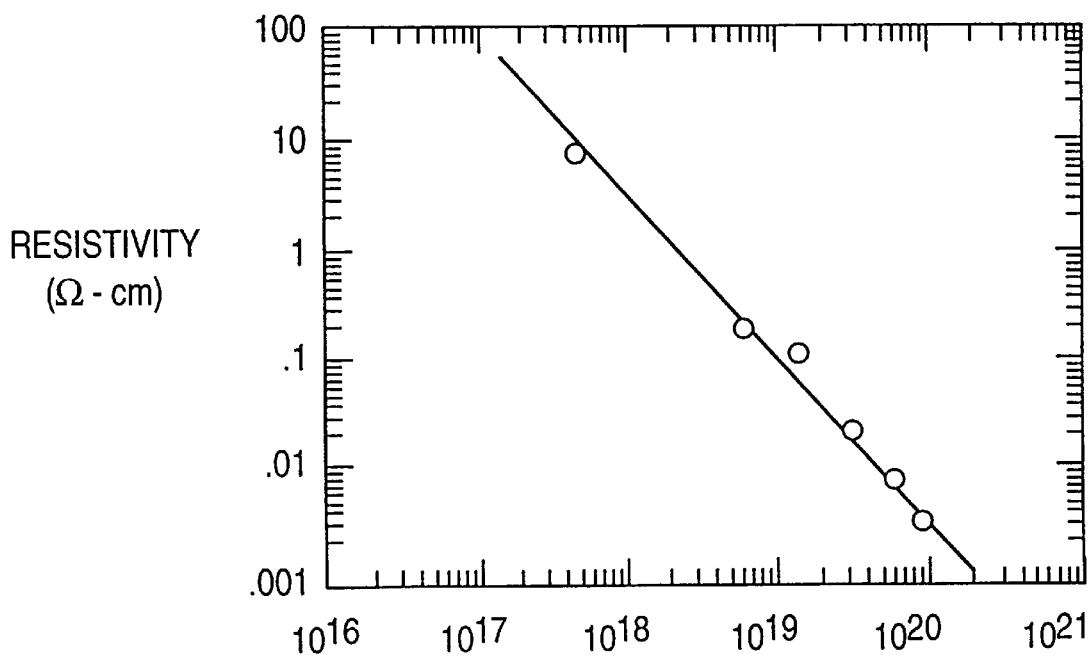
FIG. 14 is a graph of experimental data showing the relation between carrier concentration and resistivity of polycrystalline silicon.

FIG. 14 shows a relation between the carrier concentration and resistivity of polycrystalline silicon. The resistivity is normally seen to depend uniformly on the carrier concentration within the range of resistivity for use as resistance. However, this result signifies that the resistivity and the temperature dependence simultaneously vary as the carrier concentration varies. In other words, the temperature dependence is practically determined by the value of the resistivity.

When a semiconductor is used as a resistance material, the resistance value is proportional to a reciprocal of the product of carrier concentration and carrier mobility. The carrier mobility of such polycrystalline silicon has been known to depend on the grain size. The silicon film generally called polycrystalline silicon is such that when it is deposited at 600° C. or higher (high temperature), it has a bamboo structure (columnar structure) of small grain size (when the film is about 0.1 $\mu$m thick, the grain size is about 0.1 $\mu$m and a face (110) is set parallel to the surface of a substrate); and that when it is deposited at a temperature less than 600° C., e.g., at 550° C. or lower (low temperature), it becomes amorphous and when it is subjected to heat treatment, it has a dendritic structure of large grain size (when the film is about 0.1 $\mu$m thick, the grain size is about 0.1 $\mu$m or greater and a face (111) is set parallel to the surface of the substrate). If the crystal structure differs, the resistivity will also differ even though the impurity dose is invariable because the carrier mobility differs (the carrier mobility as well as carrier concentration differs even though the resistivity remains intact). In other words, there occurs a difference between the levels of temperature dependence as the carrier concentration and the resistance component in the grain boundary vary. This suggests that it is possible to control the temperature dependence by varying the temperature at which polycrystalline silicon is deposited. However, the shifting of the amorphous state to the polycrystalline state due to the deposition temperature difference takes place within a very small range of temperatures, and this makes it difficult to control delicate grain size.

The present inventors have found that, preferably, high dose ion implantation can be carried out in a specific area of a polycrystalline silicon film, which results in the formation of areas whose temperature dependence is positive and negative therein. This phenomenon will subsequently be described in detail.

Figure 15:
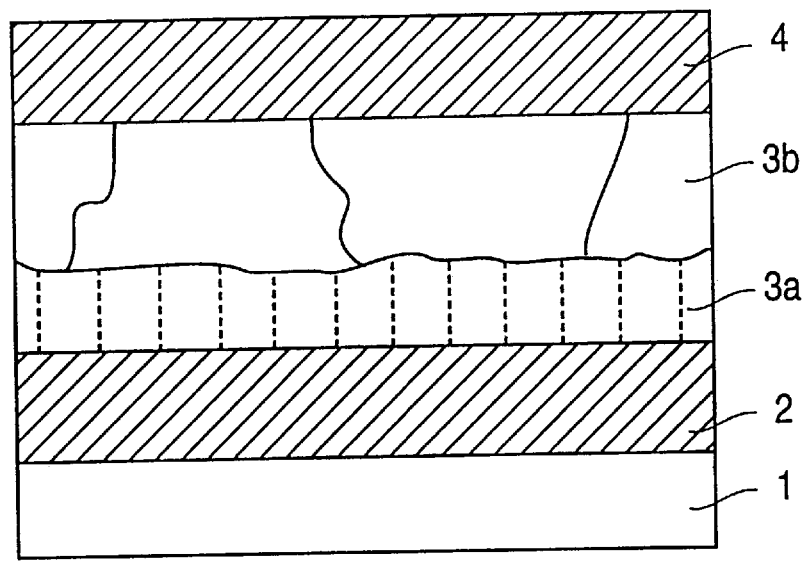
FIG. 15 is a sectional view of a resistor according to the first embodiment of the present invention.

FIG. 15 is a sectional view of the structure of a polycrystalline silicon resistor formed in accordance with the method as stated above. High dose ion implantation is carried out in the surface of the polycrystalline silicon film of small grain size that has been deposited at about 640° C., and then the polycrystalline silicon film is heat-treated. As a result, the amorphous partial thickness of the silicon film (formed by the ion implantation) grows into polycrystalline silicon of large grain size, such that the silicon film is found to be of two-layer large/small grain size structure. As can be appreciated, the large grain size structure, having had impurities at a large concentration implanted therein, has a larger impurity concentration than the small grain size structure. This is shown especially in FIG. 15, showing small-grain polycrystalline silicon (bamboo or columnar structure) $3a$ and large-grain polycrystalline silicon (dendritic structure) $3b$. In that case, the ratio of large grain size to small one depends upon acceleration energy at the time of ion implantation.

During impurity doping by ion implantation, high-energy ions collide with solid matter. The energy possessed by the ions at this time is far greater than the displacement energy (14 eV in the case of Si) of solid atoms, and while collision is being repeated, the ions are losing their energy, and cause a great deal of lattice defects. One ion makes a huge number of lattice defects in the neighborhood of room temperature, and as the quantity of injection increases groups of lattice defects are piled up to form the so-called amorphous region in a partial depth of the silicon film. Therefore, the temperature dependence is made improvable by optimizing the acceleration energy and the dose of impurities at the same sheet resistance so as to vary the ratio of the large grain size to the small one; macroscopically, this is equivalent to having controlled the grain size.

Figure 16:
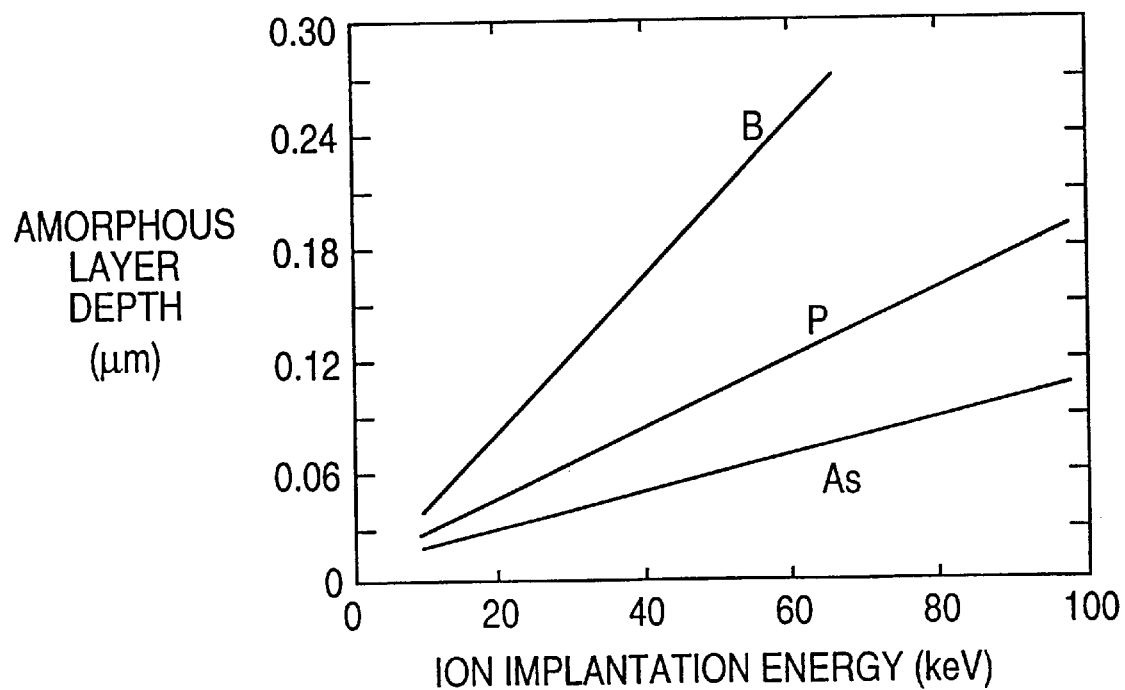
FIG. 16 is a graph of experimental data showing a depth to which a polycrystalline silicon layer is made amorphous, as a function of ion implantation energy.

FIG. 16 shows the relation between ion implantation energy and amorphous film thickness in a case wherein the dose of impurities is $1 \times 10^{16}/cm^2$ and the initial substrate temperature is room temperature. In the case of any impurity, the amorphous film thickness is seen to uniformly depend on the acceleration energy. If the projected range of impurities is used to indicate the amorphous film pressure (projected range: Rp, dispersion: $\Delta$Rp), boron=Rp, phosphorous=Rp+2$\Delta$Rp, and arsenic=Rp+3$\Delta$Rp. It has also been confirmed that if the temperature of the substrate is so controlled as to keep it at −20° C. to −30° C., the film thickness in the case of boron increases from Rp to Rp+$\Delta$RP.

Figure 1:
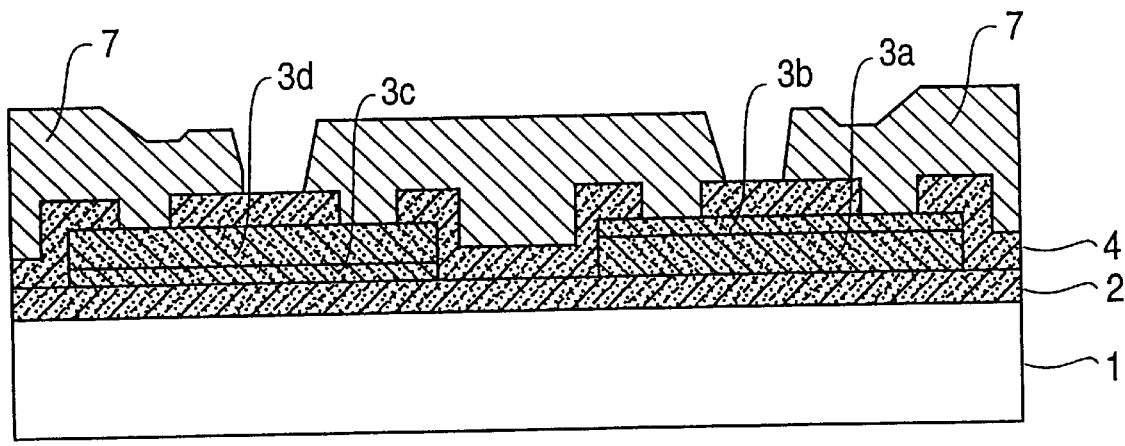
FIG. 1 is a sectional view of a resistor according to the third embodiment of the present invention.
Figure 17:
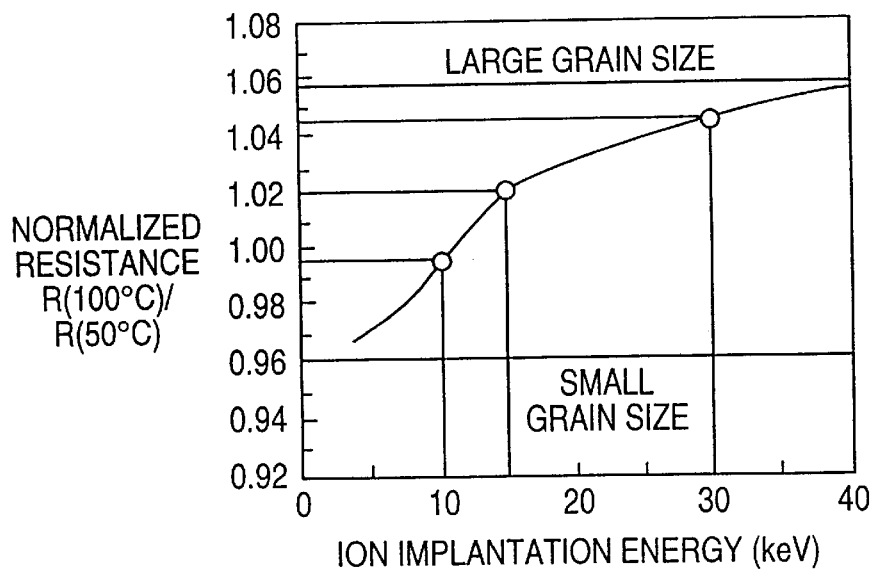
FIG. 17 is a graph of experimental data showing temperature dependence of resistance of polycrystalline silicon as a function of ion implantation energy.

FIG. 17 shows the test results of ion implantation energy and temperature dependence. Obviously, the ratio of resistance component of the single crystal to that on the grain boundary is controllable at any sheet resistance, and temperature dependence is also improvable. By optimizing the ion implantation energy like this, two or more than two kinds of polycrystalline silicon layers having any sheet resistance and temperature dependence can simultaneously be formed on the same substrate, as shown in FIG. 1.

Figure 18:
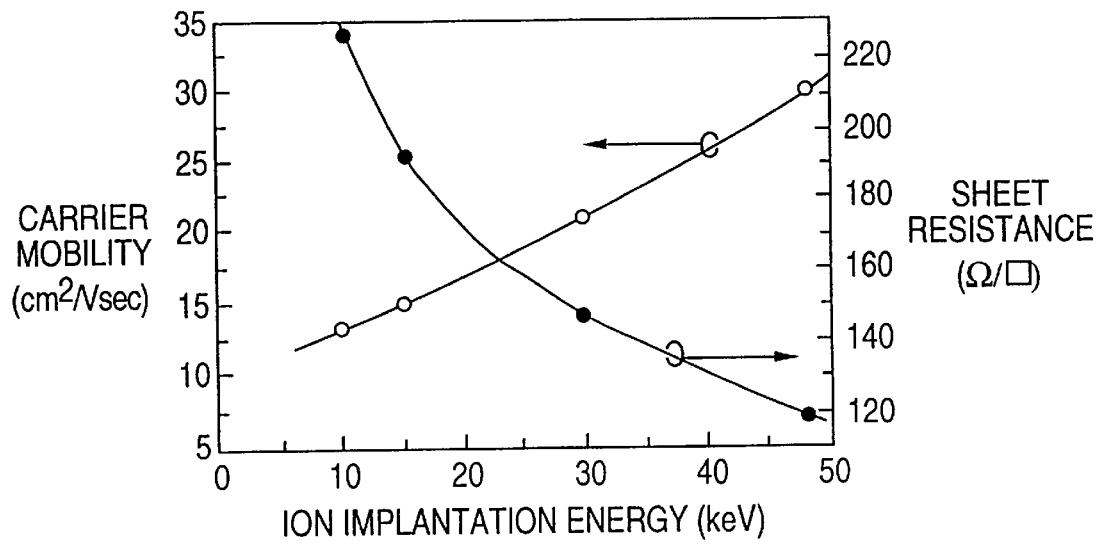
FIG. 18 is a graph of experimental data showing carrier mobility and sheet resistance of polycrystalline silicon as a function of ion implantation energy.

FIG. 18 shows a relation between carrier mobility with respect to ion implantation energy, and sheet resistance with respect to ion implantation energy. In comparison with the polycrystalline silicon layer of small grain size, the carrier mobility tends to increase in the case of the polycrystalline silicon layer of large grain size. Therefore, the sheet resistance is made controllable by regulating acceleration energy at the time of ion implantation so as to vary the ratio of large grain size to small one on condition that the dose of ion implantation is the same. The sheet resistance is, needless to say, made controllable by varying the dose. By optimizing the acceleration energy and the dose of impurities, two or more than two polycrystalline silicon layers having any sheet resistance and temperature dependence can thus be formed on the same substrate.

Figure 19:
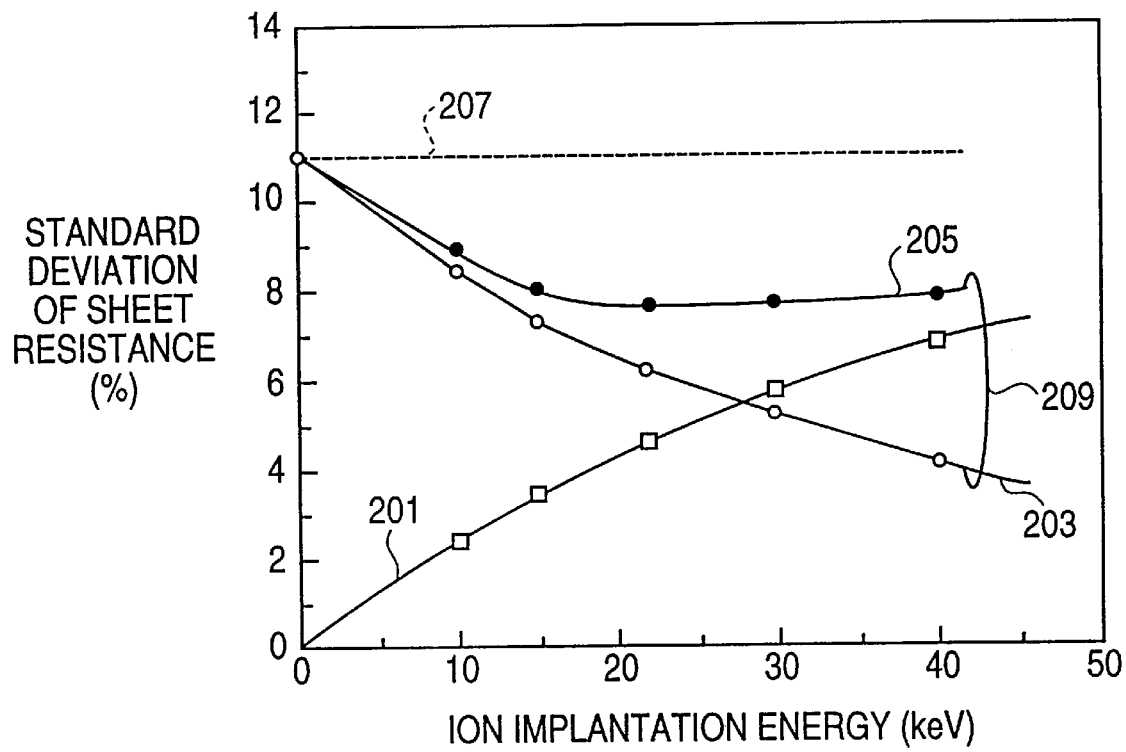
FIG. 19 is a graph showing a relation between ion implantation energy and sheet resistance variation of polycrystalline silicon.
Figure 20:
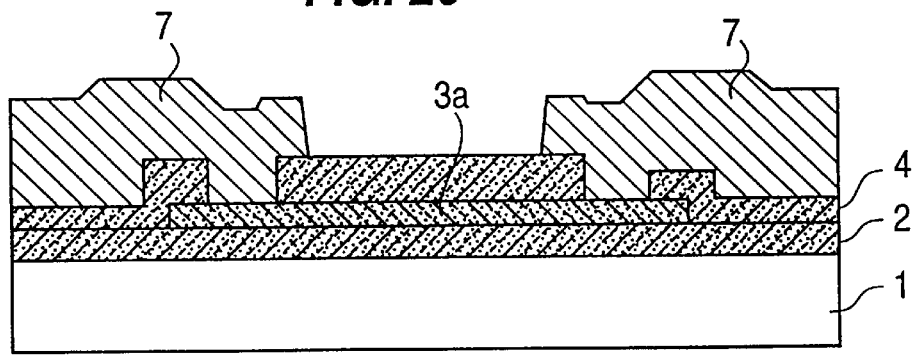
FIG. 20 is a sectional view of a resistor of conventional structure.
Figure 21:
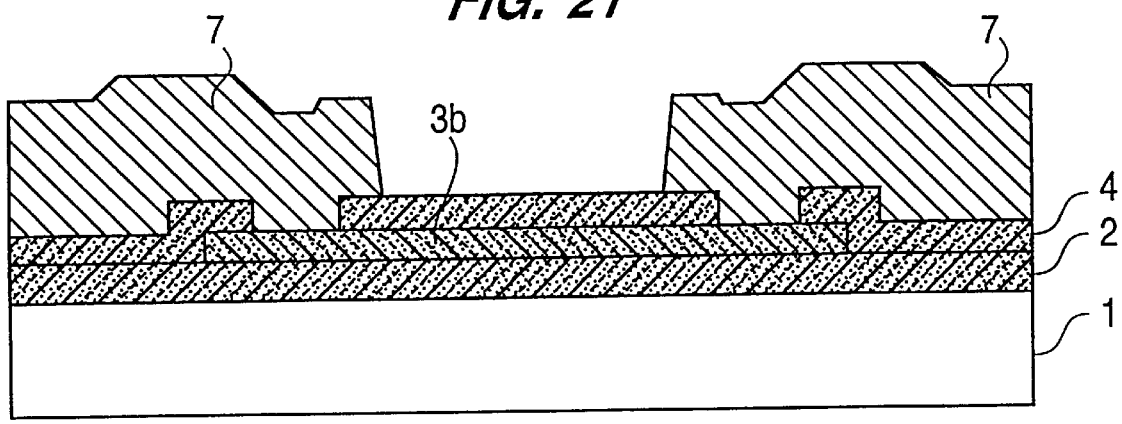
FIG. 21 is a sectional view of a resistor of conventional structure.
Figure 22:
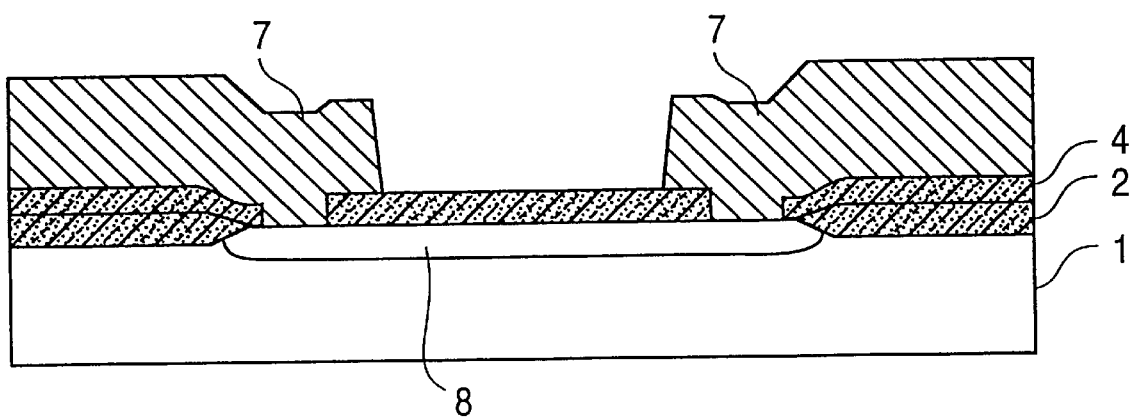
FIG. 22 is a sectional view of a resistor of conventional structure.

In the case of the aforesaid two-layer structure, moreover, the sheet resistance is substantially determined by the polycrystalline silicon layer of large grain size (low-resistance layer). Even though the thickness of the polycrystalline silicon layer varies at the time the layer is deposited, the deviation of the sheet resistance is reduced with respect to that of the film thickness, as long as the deviation of the film thickness stays within the range of the polycrystalline silicon layer of small grain size (high-resistance layer). FIG. 19 shows the relation between ion implantation energy and the deviation of sheet resistance. On the assumption that the deviation of the polycrystalline silicon film is in the range of 200 nm ±10% (20 nm), the deviation of sheet resistance in the two-layer structure is computed while acceleration energy is varied. At that time, it is also expected that the film thickness in the layer of large grain size has a deviation of ±10%. In FIG. 19, curve 201 is the standard deviation of sheet resistance of the amorphous portion of the polycrystalline silicon film $\sigma_A$, as a function of ion implantation energy in forming the amorphous portion, where the film initially has a deviation of ±10%. Similarly, curve 203 is the standard deviation of sheet resistance of the remaining portion of the polycrystalline silicon film $\sigma_D$, as a function of ion implantation energy in forming the amorphous portion, wherein the film initially has a thickness deviation of ±10%. Curve 205 is $\sqrt{\sigma_A^2 + \sigma_D^2}$. As shown by numeral 209, these curves 201, 203 and 205 represent the two-layer film. Curve 207 is the standard deviation of sheet resistance of a single layer polycrystalline silicon film (e.g., without ion implantation forming the two-layer structure, this film having a thickness deviation of ±10%). When acceleration energy is optimized in the two-layer structure, the deviation of sheet resistance is seen to decrease.

In order to make the polycrystalline silicon amorphous with stability, it is effective to hold the semiconductor substrate at low temperatures close to room temperature, at the time of ion implantation. Control of the temperature of the substrate so as to keep it at low levels prevents the recovery of crystal defects originating from the generation of heat from the substrate at the time of high dose ion implantation. In other words, the percentage of amorphousness is made variable by controlling the temperature of the semiconductor substrate at the time of ion implantation, and consequently the temperature dependence can also be controlled.

The two-layer structure as stated above can also be made by stacking polycrystalline silicon layers which are formed (deposited) under different conditions. Due to the different deposition conditions, layers having different grain sizes can be formed. In this case, an oxide film is desirably formed on the surface of a lower layer to prevent the crystal structure of the polycrystalline silicon which forms the upper layer from being affected by the crystal structure of the lower layer. Such oxide film is especially preferred where the polycrystalline silicon is doped with an n-type dopant, and is not as necessary when the polycrystalline silicon is doped with an p-type dopant. At this time, the thickness of the oxide film should be reduced to the extent that the electric conduction between the upper and lower layer is not impaired. The oxide film should preferably be 1 nm thick or greater to prevent it from affecting the crystal structure, and 4 nm thick or less to make tunnel current readily flow. When attention is riveted to only the improvement of temperature dependence, the two-layer structure formed by the above method is effective.

EMBODIMENT 1

Figure 2:
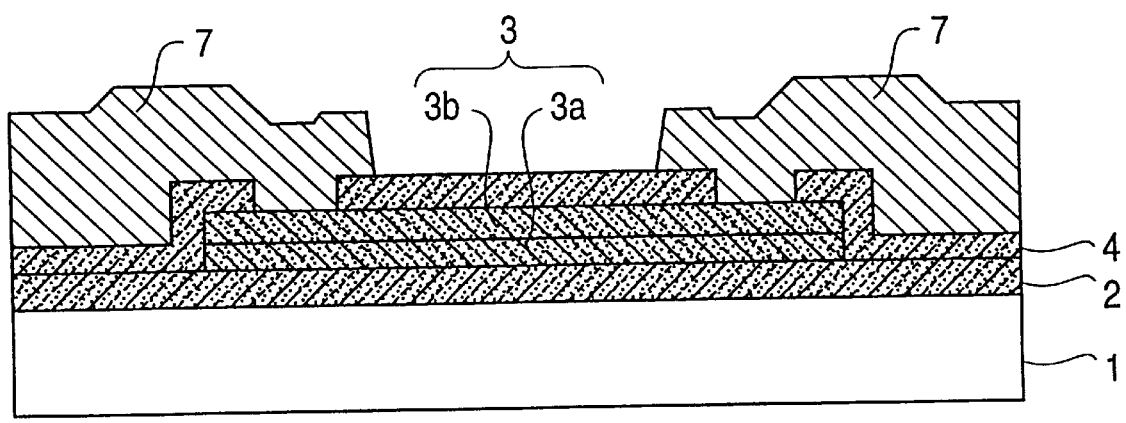
FIG. 2 is a sectional view of a resistor according to the first embodiment of the present invention.

Referring to FIG. 2, a first embodiment of the present invention will be described. FIG. 2 illustrates a resistor embodying the present invention, wherein an attempt is made to improve temperature dependence of resistance (e.g., provide a resistor whose resistance is substantially independent of temperature over a temperature range of use of the resistor) by providing a polycrystalline silicon film 3 of two-layer structure including a first polycrystalline silicon layer 3a of small grain size and a second polycrystalline silicon layer 3b of large grain size. Thus, the resistor in FIG. 2 is constituted by the first and second polycrystalline silicon films 3a, 3b, the resistor being electrically connected at both ends to aluminum electrodes 7,7.

The prior art structure has shortcomings in that fluctuations in temperature dependence of resistance is dependent on resistivity, because polycrystalline silicon film or single crystal structure is used as a resistance material. Since the resistance of polycrystalline silicon is the sum of a single crystal component and potential barrier on the grain boundary, the temperature dependence can be improved by controlling the grain size.

Figure 23:
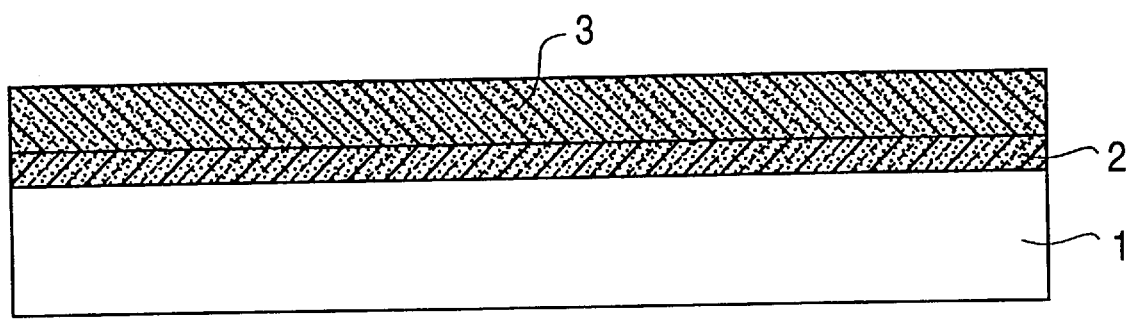
FIG. 23 is a sectional view of the resistor according to the first embodiment of the present invention, showing a process of manufacturing the same.
Figure 24:
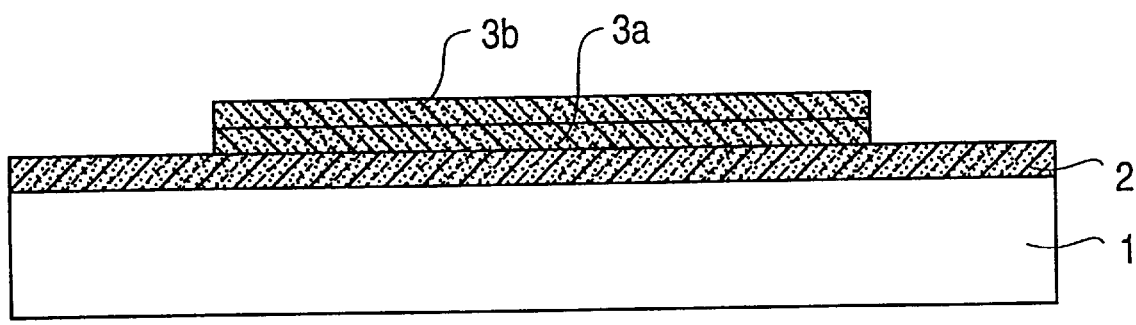
FIG. 24 is a sectional view of the resistor according to the first embodiment of the present invention, showing a process of manufacturing the same.
Figure 25:
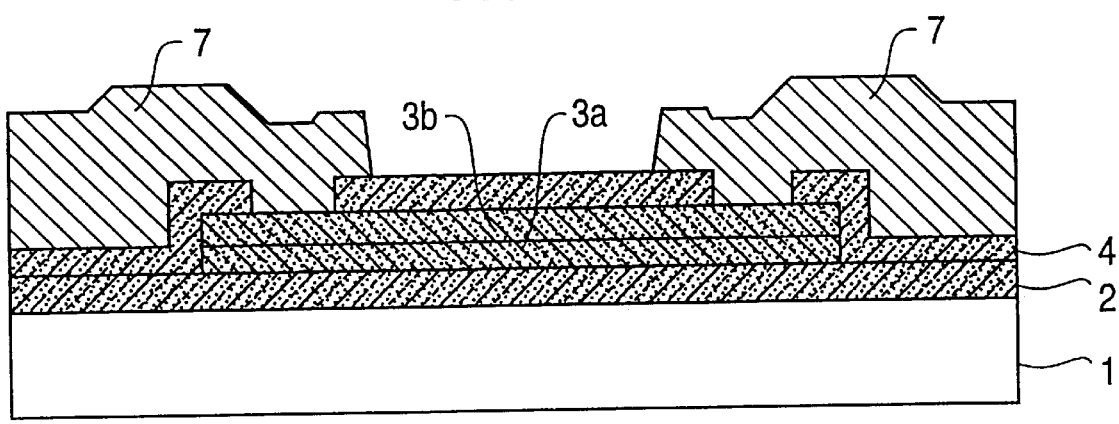
FIG. 25 is a sectional view of the resistor according to the first embodiment of the present invention, showing a process of manufacturing the same.
Figure 56:
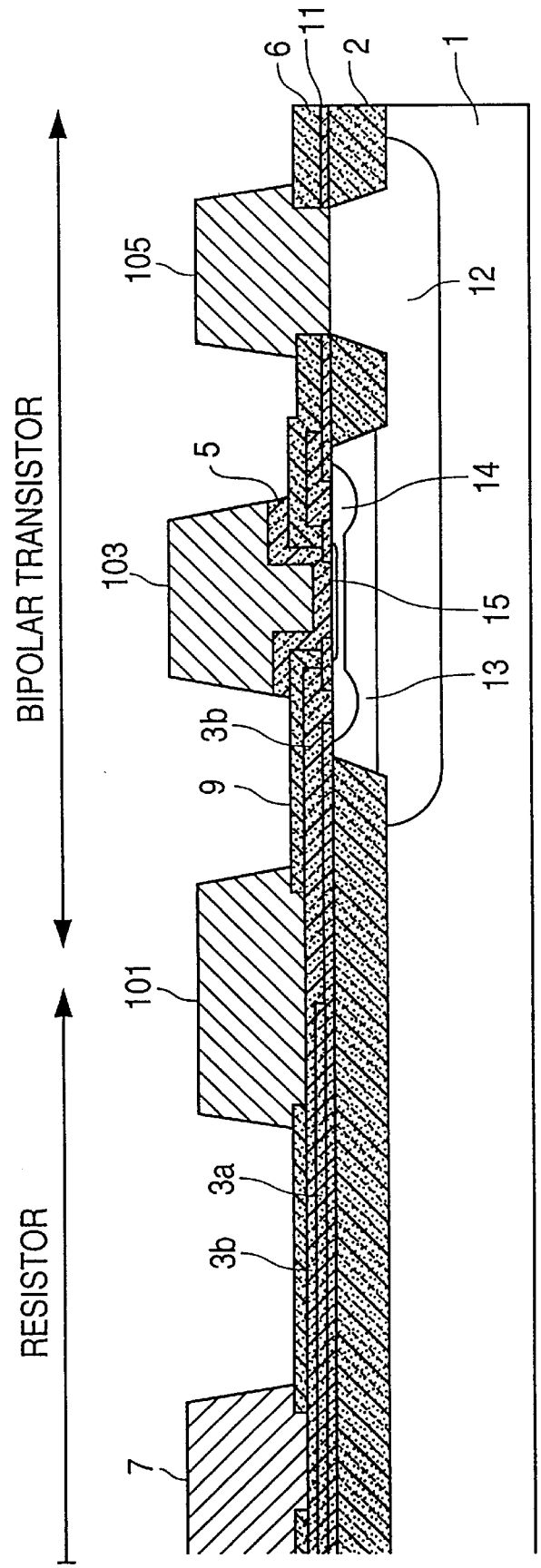
FIG. 56 is a sectional view of the semiconductor device according to the first embodiment of the present invention.

FIGS. 23 to 25 illustrate a process of manufacturing a semiconductor device according to the present embodiment, showing process steps for building the sectional structure of FIG. 2. FIG. 56 shows an exemplary application of the semiconductor device to a conventional bipolar integrated circuit. Referring to drawing numbers, a description will subsequently be given of the process steps and the application thereof.

First, a silicon dioxide film 2 is formed on the surface of a semiconductor substrate 1. Then a polycrystalline silicon film 3 is formed on the surface of the silicon dioxide film 2. At this time, the deposition temperature of the polycrystalline silicon is set at 600° C. or higher and a crystal structure of small grain size (e.g., grain size is about 0.1 $\mu$m when the film thickness is 0.1 $\mu$m, with a surface (110) in parallel to that of the substrate) is formed (FIG. 23). Then high dose of ion implantation is implemented to carry out the injection of impurities into the polycrystalline silicon and to make amorphous a partial thickness of the polycrystalline silicon simultaneously. The temperature of the semiconductor substrate at the time of ion implantation is so controlled as to keep it as low as, for example, 0° C., whereby defect recovery due to a rise in the temperature of the substrate corresponding to implantation power is prevented, whereas the stabilization of amorphousness is achieved.

Moreover, acceleration energy is selected so that the percentage of amorphousness of the polycrystalline silicon (the depth of the amorphousness) conforms to a desired value. Then, a heat treatment is performed at 600° C. or higher, to grow the amorphous portion into polycrystalline silicon of large grain size (e.g., grain size is about 0.1 $\mu$m or greater when the film thickness is 0.1 $\mu$m, with a surface (111) in parallel to that of the substrate) so as to form a two-layer structure of large (3b)/small (3a) grain size. Then, the polycrystalline silicon is subjected to patterning (FIG. 24), and then a silicon dioxide layer 4 is formed on the surface of the semiconductor substrate, and the known photoetching technique is used to form a contact hole in the silicon dioxide layer so as to expose the polycrystalline silicon layer. Then an Al electrode 7 is formed in such a manner as to contact the polycrystalline silicon layer via the contact hole. The semiconductor device of FIG. 2 (FIG. 25), having any desired temperature dependence of resistance, including a temperature dependence of resistance that is substantially zero, is thus attainable. With respect to the aforesaid ion implantation, boron ions are implanted in the polycrystalline silicon film of small grain size, 0.1 $\mu$m thick, for example, under the conditions of an acceleration energy of 10 keV and a dose of $5 \times 10^{15}/\text{cm}^2$. With a temperature fluctuation of 65° C. ±20° C., it is possible to set the regulation of sheet resistance at less than ±0.5% in this case. Even though the polycrystalline silicon layer of large grain size (3b) and the polycrystalline silicon layer of small grain size (3a) are formed by varying the deposition temperature, their structure will needless to say be similar to that of those formed otherwise.

FIG. 56 shows a case where the semiconductor device according to the present invention is applied to a bipolar integrated circuit. In FIG. 56, numeral 5 denotes a polycrystalline silicon film, 6, 9 and 11 silicon dioxide films, 12 and 15 p-type diffusion regions, 13 a p-type epitaxial layer, and 14 an n-type diffusion region. P-type epitaxial layer 13 and p-type diffusion region 12 together form a collector of a bipolar transistor, while n-type diffusion region 14 and p-type diffusion region 15 respectively forms the base and emitter regions of the bipolar transistor. Numeral 101 is the base electrode, while 103 and 105 respectively are emitter and collector electrodes of the bipolar transistor. Hereinafter, like reference characters designate like component elements. The polycrystalline silicon layer 3b is simultaneously used as the base lead-out electrode of the bipolar transistor and as a resistor, and this signifies that the present invention is thus applicable without substantially increasing the number of steps.

EMBODIMENT 2

Figure 3:
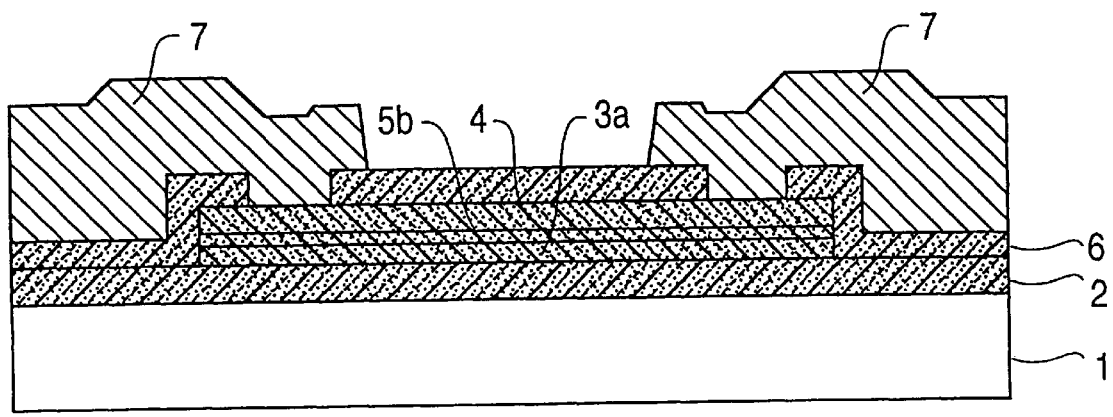
FIG. 3 is a sectional view of a resistor according to the second embodiment of the present invention.

Referring to FIG. 3, a second embodiment will be described. FIG. 3 illustrates a resistor embodying the present invention, wherein an attempt is also made to improve temperature dependence of resistance by providing a polycrystalline silicon film of two-layer structure including a first polycrystalline silicon layer 3a of small grain size and a second polycrystalline silicon layer 5b of large grain size. More specifically, the two-layer structure of polycrystalline silicon is made attainable likewise by varying the deposition temperature at which the polycrystalline silicon of large grain size and that of small grain size are formed. However, the use of n-type impurities of such as phosphorous in that method may cause one or both of the polycrystalline silicon films to affect the other, or each other, as far as their crystal structure is concerned, during the process of crystallization with heat treatment, thus making it difficult to attain a two-layer structure of good quality. The crystal structure of both layers is maintained and the temperature dependence of resistance is effectively improved by forming an oxide film 4 (e.g., a native oxide film 1 nm thick or greater to prevent crystallinity from being affected and 4 nm thick or less to facilitate the flow of tunnel current) which is thin enough not to impair electric conduction between the polycrystalline silicon films different in crystal structure.

Figure 26:
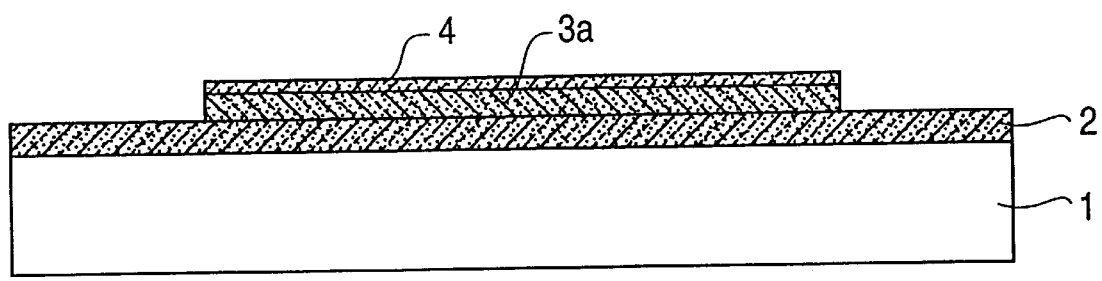
FIG. 26 is a sectional view of the resistor according to the second embodiment of the present invention, showing a process of manufacturing the same.
Figure 27:
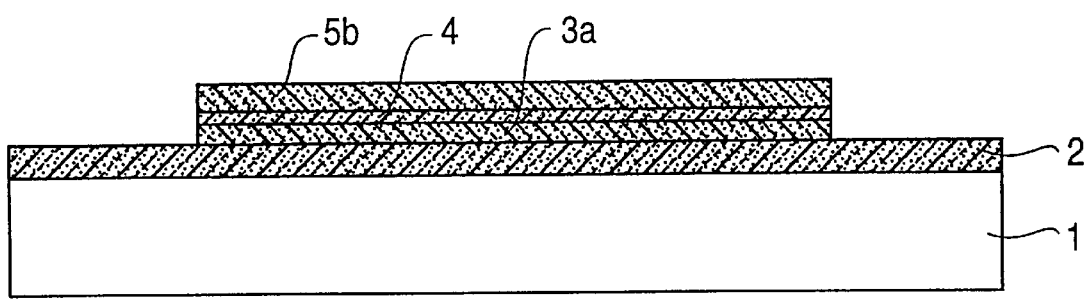
FIG. 27 is a sectional view of the resistor according to the second embodiment of the present invention, showing a process of manufacturing the same.
Figure 28:
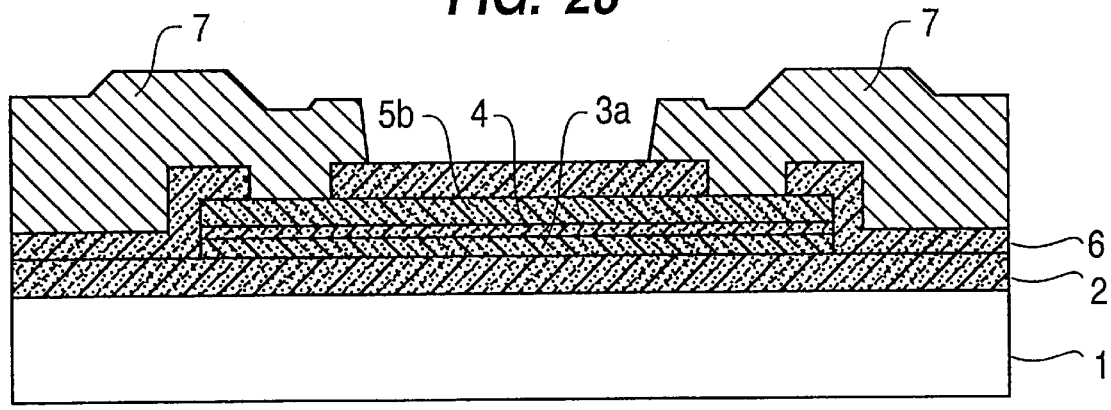
FIG. 28 is a sectional view of the resistor according to the second embodiment of the present invention, showing a process of manufacturing the same.

FIGS. 26 to 28 illustrate a process of manufacturing a semiconductor device according to the present embodiment, showing process steps for building the sectional structure of FIG. 3. Referring to drawing numbers, a description will subsequently be given of the process steps, and of an exemplary application of the semiconductor device.

First, a silicon dioxide film 2 is formed on the surface of a semiconductor substrate 1. Then the polycrystalline silicon film 3a is formed on the surface of the silicon dioxide film 2. At this time, the deposition temperature of the polycrystalline silicon is set at 600° C. or higher, and a crystal structure of small grain size is formed (FIG. 26). Then, impurities are diffused from the surface of the substrate, and the polycrystalline silicon film 3a is oxidized in the atmosphere, so that the silicon dioxide film 4 is formed. Then, a polycrystalline silicon film is deposited at a deposition temperature of as low as 550° C. or lower, for example, and impurities are diffused again and doped. The polycrystalline silicon film 5b of large grain size is thus obtained by rendering the grain size gigantic. Then, the polycrystalline silicon films 3a and 5b are subjected to patterning (FIG. 27). Further, a silicon dioxide film 6 is formed overlying the semiconductor substrate and the polycrystalline silicon films 3a and 5b, and a known photoetching technique is used to form a contact hole exposing the polycrystalline silicon film 5b. Then, an Al electrode 7 is formed in such a manner as to contact the polycrystalline silicon film 5b via the contact hole. The semiconductor device of FIG. 3 (or FIG. 28) having any desired temperature dependence of resistance is thus attainable.

Incidentally, the same effect will be achievable even though the positions of the polycrystalline silicon films 3a, 5b are exchanged. Further, the same effect will be also achievable even though ion injection is employed for the injection of impurities into the polycrystalline silicon film, even though impurities are added to the deposited gas or even though the dopant is changed (e.g., from phosphorous to boron).

EMBODIMENT 3

This embodiment 3 is an application of the improved temperature dependence resulting from the two-layer structure of polycrystalline silicon resistors shown in Embodiments 1 and 2.

As is clear from FIG. 1, two or more than two kinds of resistor layers 3a, 3b, 3c, 3d, different from each other in sheet resistance, are formed in polycrystalline silicon layers laid on one and the same substrate. If the methods referred to in Embodiments 1 and 2 are used (e.g., by carefully selecting the conditions of ion implantation when forming layers 3b and 3d), sheet resistance and temperature dependence may be varied as desired. In other words, the temperature dependence of two or more than two kinds of resistors different in sheet resistance can simultaneously be reduced to almost zero or slightly positive. Thus, each of the resistor formed by layers 3a and 3b, and the resistor formed by layers 3c and 3d, can have temperature dependence of resistance that is substantially zero (or where 3a, 3b, 3c and 3d are electrically connected as in FIG. 1, a temperature dependence of resistance of the four layers 3a, 3b, 3c and 3d can be made to be substantially zero).

Figure 29:
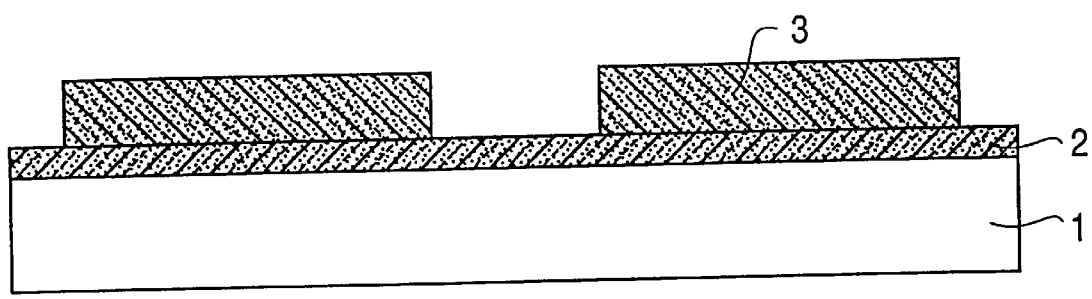
FIG. 29 is a sectional view of the resistor according to the third embodiment of the present invention, showing a process of manufacturing the same.
Figure 30:
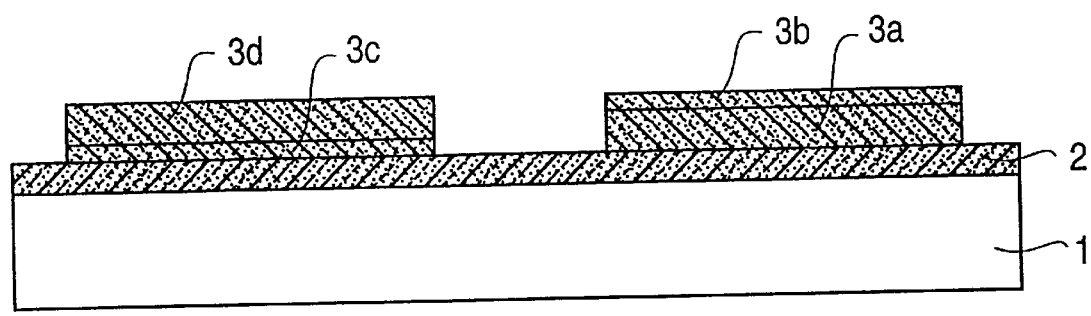
FIG. 30 is a sectional view of the resistor according to the third embodiment of the present invention, showing a process of manufacturing the same.
Figure 31:
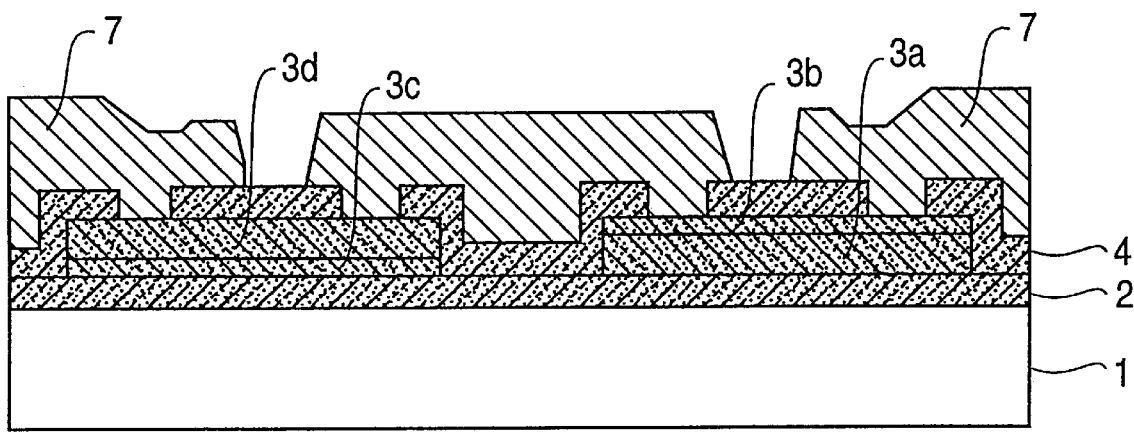
FIG. 31 is a sectional view of the resistor according to the third embodiment of the present invention, showing a process of manufacturing the same.

FIGS. 29 to 31 illustrate a process of manufacturing a semiconductor device according to the present embodiment, showing process steps for building the sectional structure of FIG. 1. Referring to drawing numbers, a description will subsequently be given of the process steps.

First, a silicon dioxide film 2 is formed on the surface of the semiconductor substrate 1. Then a polycrystalline silicon film 3 is formed on the surface of the semiconductor, and a known photoetching technique is used to subject the polycrystalline silicon film 3 to patterning, so as to form separated portions of the polycrystalline silicon film (FIG. 29). Then, a high dose of ion implantation (e.g., boron $\geq 1 \times 10^{15}/\text{cm}^2$) is implemented to carry out simultaneously the injection of impurities into the polycrystalline silicon and making amorphous a surface layer of the polycrystalline silicon film 3. At this time, the acceleration energy and the quantity of implantation are caused to vary for the separated portions. For example, acceleration energy is set at 10 keV when the film thickness of 3b is 0.1 μm and at 20 keV when the film thickness of 3d is 0.2 μm. Subsequently, heat treatment is made at 600° C. or higher to grow a two-layer structure of large grain size (3b, 3d)/small grain size (3a, 3c) (FIG. 30). Then, a silicon dioxide film 4 is formed overlying the surface of the semiconductor substrate and the polycrystalline silicon films, and a known photoetching technique is used to form contact holes exposing the polycrystalline silicon layers 3b and 3d, and then an Al electrode 7 is formed in such a manner as to contact the layers 3b and 3d via the contact holes, so that there is provided a semiconductor device in which the temperature dependence of resistors different in sheet resistance as shown in FIG. 1 (or FIG. 31) is reduced to almost zero or slightly positive. The same effect is obtained by using the method of Embodiment 2 for the formation of the two-layer structure.

EMBODIMENT 4

Figure 4:
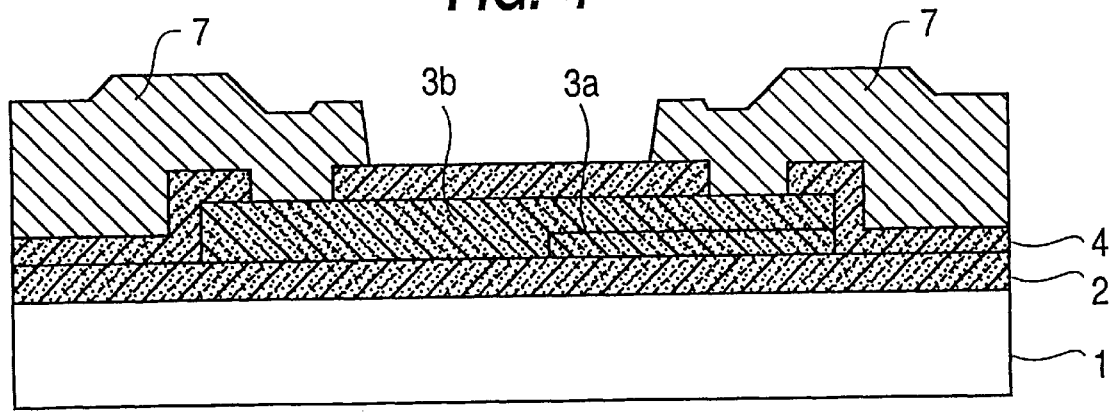
FIG. 4 is a sectional view of a resistor according to the fourth embodiment of the present invention.

Embodiment 4 illustrates structure having increased effectiveness in improving temperature dependence of resistance by means of a two-layer structure of the polycrystalline silicon resistors shown in Embodiment 1 and 2. Referring to FIG. 4, Embodiment 4 will be described. FIG. 4 illustrates a resistor embodying the present invention, wherein the thickness of the layers of different crystal structure (large grain size/small grain size), of the polycrystalline silicon layers 3a, 3b, is caused to vary, depending on its position on the substrate 1, to make effective the temperature dependence as stated above.

Figure 32:
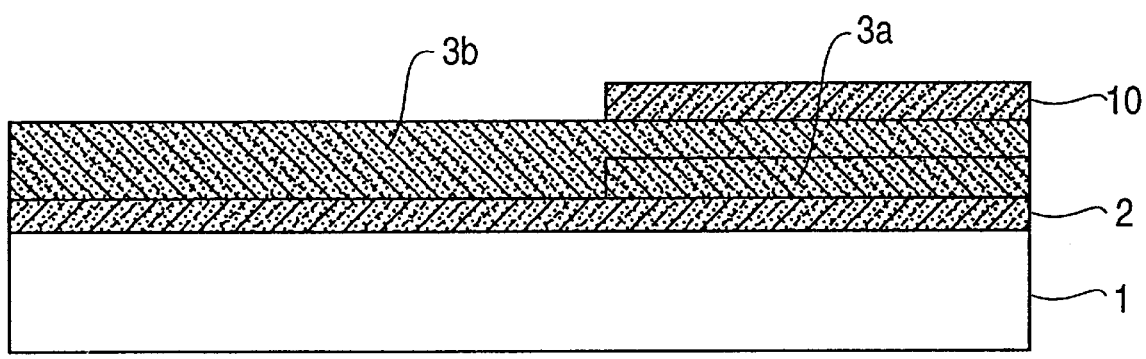
FIG. 32 is a sectional view of the resistor according to the fourth embodiment of the present invention, showing a process of manufacturing the same.
Figure 33:
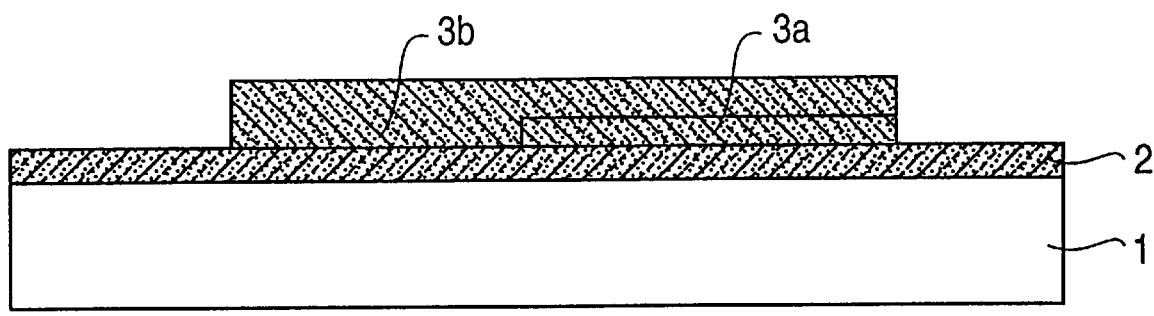
FIG. 33 is a sectional view of the resistor according to the fourth embodiment of the present invention, showing a process of manufacturing the same.
Figure 34:
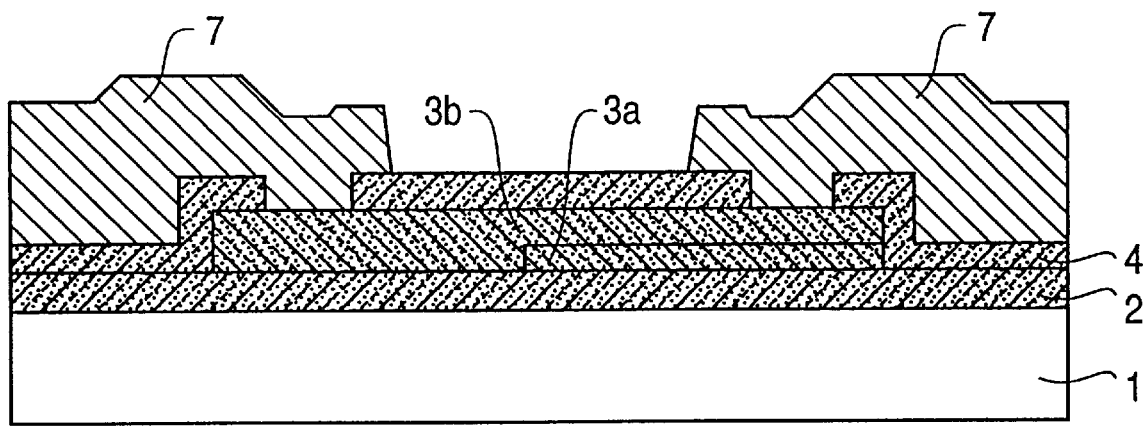
FIG. 34 is a sectional view of the resistor according to the fourth embodiment of the present invention, showing a process of manufacturing the same.

FIGS. 32 to 34 illustrate a process of manufacturing a semiconductor device according to the present embodiment, showing process steps before a sectional structure of FIG. 4 is built. Referring to drawing numbers, a description will subsequently be given of the process steps.

First a silicon dioxide film 2 is formed on a surface of the semiconductor substrate 1. Then a polycrystalline silicon film is formed overlying silicon dioxide film 2. Subsequently, a silicon nitride film 10 is formed on a desired portion on the surface of the polycrystalline silicon film. Then, a high dose of ion implantation (e.g., boron $\geq 1 \times 10^{15}/\text{cm}^2$) is implemented to carry out simultaneously the injection of impurities into the polycrystalline silicon film and making amorphous the polycrystalline silicon film (FIG. 32). At this time, the thickness of the silicon nitride film and acceleration energy are optimized so that the temperature dependence of each of (1) the polycrystalline silicon film portion, beneath the silicon nitride film, that does not have impurities implanted therein, and (2) a remaining portion of the polycrystalline silicon film, may have any desired value. If the acceleration energy varies in the range of 5 keV to 40 keV, the temperature dependence, in the range of −50° C. to ±50° C., of sheet resistance becomes controllable in the range of −3% to +5%. Then, heat treatment is conducted at 600° C. or higher to make the amorphous portion grow into polycrystalline silicon of large grain size, so as to form a two-layer structure of large grain size (3b)/small grain size (3a), as seen in FIG. 32. Then the polycrystalline silicon film is subjected to patterning (FIG. 33), the silicon dioxide layer 4 is formed on the surface of the polycrystalline silicon, and a known photoetching technique is used to form contact holes so as to expose the polycrystalline silicon film 3b. Then the Al electrode 7 is formed in such a manner as to contact the polycrystalline silicon film 3b via the contact holes, so that a semiconductor device having any desired temperature dependence of resistance, as shown in FIG. 4 (or FIG. 34), is provided.

As can be appreciated from FIG. 34, the polycrystalline silicon films 3a, 3b, each having a different temperature dependence of resistance, can be electrically connected in series or in parallel, to form conducting structure according to the present invention.

EMBODIMENT 5

Figure 5:
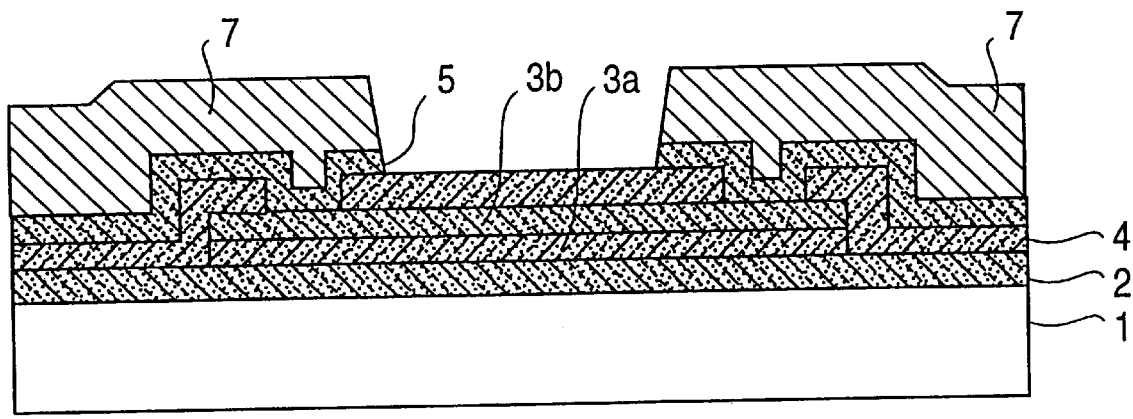
FIG. 5 is a sectional view of a resistor according to the fifth embodiment of the present invention.

Embodiment 5 illustrates structure having increased effectiveness in improving temperature dependence of resistance by means of the two-layer structure of the polycrystalline silicon resistors shown in Embodiments 1 and 2, simultaneously with a reduction in contact resistance with the electrode. Referring to FIG. 5, Embodiment 5 will be described. FIG. 5 illustrates a resistor embodying the present invention, wherein an attempt is made to reduce contact resistance by making a polycrystalline silicon layer 5, in contact with the electrode 7, having a high carrier concentration (e.g., $1\times10^{19}$ cm$^{-3}$ or more).

Figure 35:
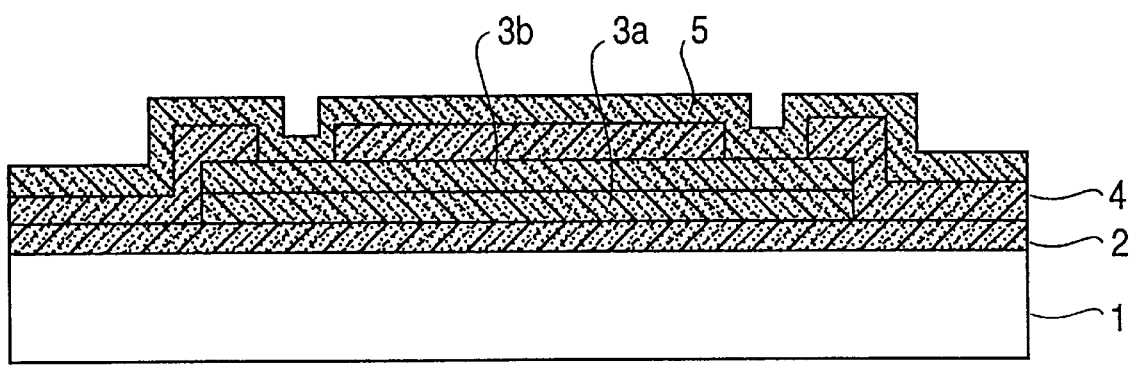
FIG. 35 is a sectional view of the resistor according to the fifth embodiment of the present invention, showing a process of manufacturing the same.
Figure 36:
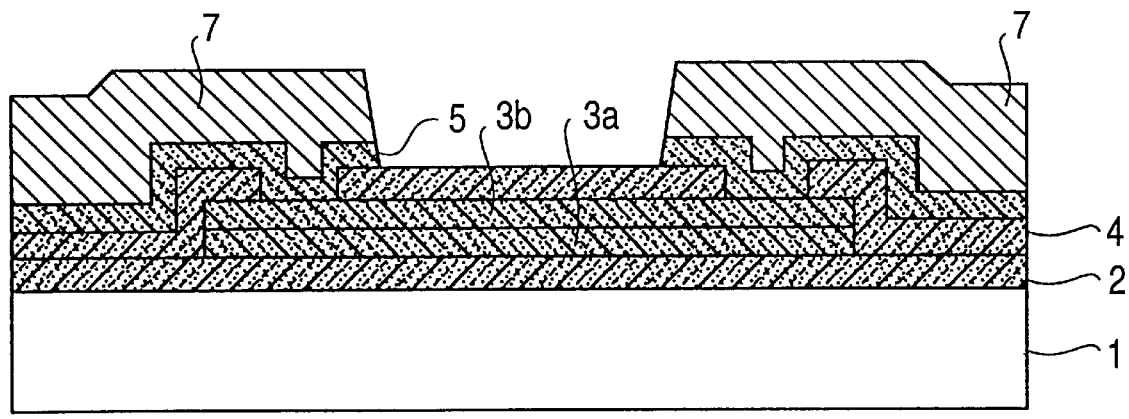
FIG. 36 is a sectional view of the resistor according to the fifth embodiment of the present invention, showing a process of manufacturing the same.

FIGS. 35 and 36 illustrate a process of manufacturing a semiconductor device according to the present embodiment, showing process steps for forming the sectional structure of FIG. 5. Referring to drawing numbers, a description will subsequently be given of the process steps.

First, the method shown in Embodiment 1 is used to attain a structure of FIG. 24. Then the silicon dioxide layer 4 is formed on the surface of the polycrystalline silicon film, and a known photoetching technique is used to form contact holes so as to expose the polycrystalline silicon film 3b. Then, a polycrystalline silicon film 5 is formed on the surface of the silicon dioxide layer 4 and in the contact holes so as to contact the silicon film 3b, and a known technique is used to dope highly concentrated impurities into film 5 (FIG. 35). The silicon film 5 is then patterned by known photoetching techniques. Then, an Al electrode 7 is formed in such a manner as to contact silicon film 5, to acquire a semiconductor device having a desired temperature dependence of resistance and reduced contact resistance, as shown in FIG. 5 (or FIG. 36).

EMBODIMENT 6

Figure 6:
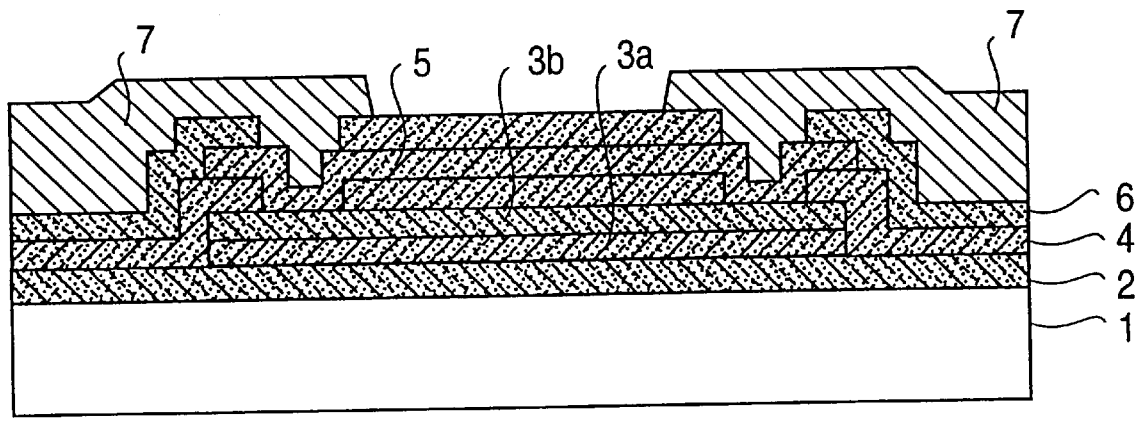
FIG. 6 is a sectional view of a resistor according to the sixth embodiment of the present invention.
Figure 37:
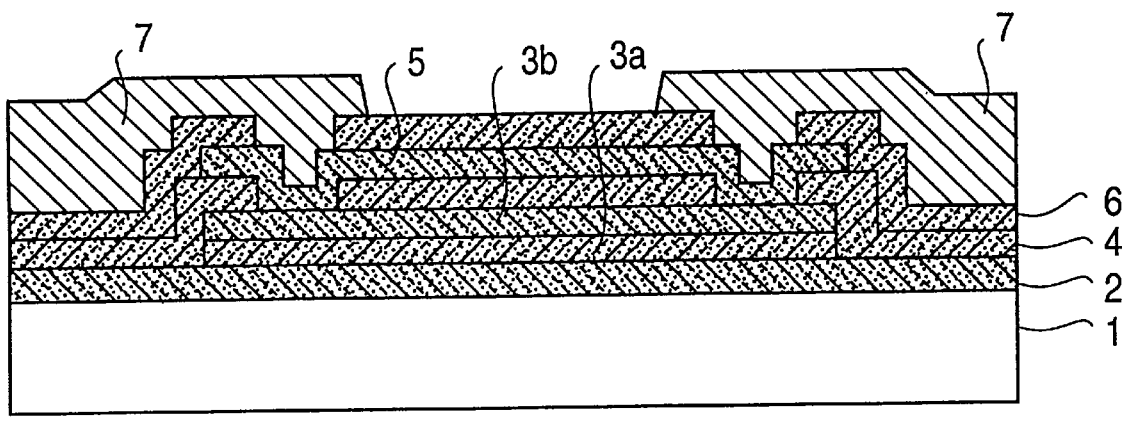
FIG. 37 is a sectional view of the resistor according to the sixth embodiment of the present invention, showing a process of manufacturing the same.

Referring to FIG. 6, Embodiment 6 will be described. Embodiment 6 illustrates structure having increased effectiveness in improving temperature dependence of resistance by means of the two-layer structure of the polycrystalline silicon resistors shown in Embodiments 1 and 2. A polycrystalline silicon layer whose carrier concentration is at $1\times10^{19}$/cm$^3$ or less generally has negative temperature dependence, and at greater than $1\times10^{19}$/cm$^3$ has positive temperature dependence. This means that any temperature dependence is obtainable by forming resistor layers different in temperature dependence in the intended operating temperature range, in the structure shown in FIG. 6. In other words, the temperature dependence of resistance can be set closer to zero, and this structure is intended to reduce contact resistance to the electrode simultaneously with improvement in temperature dependence. The present invention is, as shown in FIG. 6, implemented to effect the control of temperature dependence by using a combination of polycrystalline silicon films different in temperature dependence, and to reduce the contact resistance by giving the polycrystalline silicon film 5, in contact with the electrode, a high carrier concentration. For example, it is possible to connect a resistor with an absolute value of 1120 Ω and a temperature dependence of +10.4% in the temperature range of −50° C. to 50° C., and a resistor with the respective values of 2700 Ω and −19.5%, in parallel, and to obtain a resistor with an absolute value of 790 Ω, and temperature dependence of ±0.5%. FIGS. 35 and 37 illustrate a process of manufacturing a semiconductor device according to the present embodiment, showing process steps for forming the sectional structure of FIG. 6. Referring to drawing numbers, a description will subsequently be given of the process steps.

First, the method shown in Embodiment 5 is used to attain a structure of FIG. 35. Then, a known photoetching technique is used to subject the polycrystalline silicon film 5 to patterning. Subsequently, a silicon dioxide layer 6 is formed overlying the surface of the semiconductor substrate, on polycrystalline silicon film 5, and a known photoetching technique is used to form contact holes exposing the polycrystalline silicon film 5. Then, an Al electrode is formed in such a manner as to contact polycrystalline silicon film 5 via the contact holes to acquire a semiconductor device having any desired temperature dependence of resistance and reduced contact resistance, as shown in FIG. 6 (or FIG. 37).

EMBODIMENT 7

Figure 7:
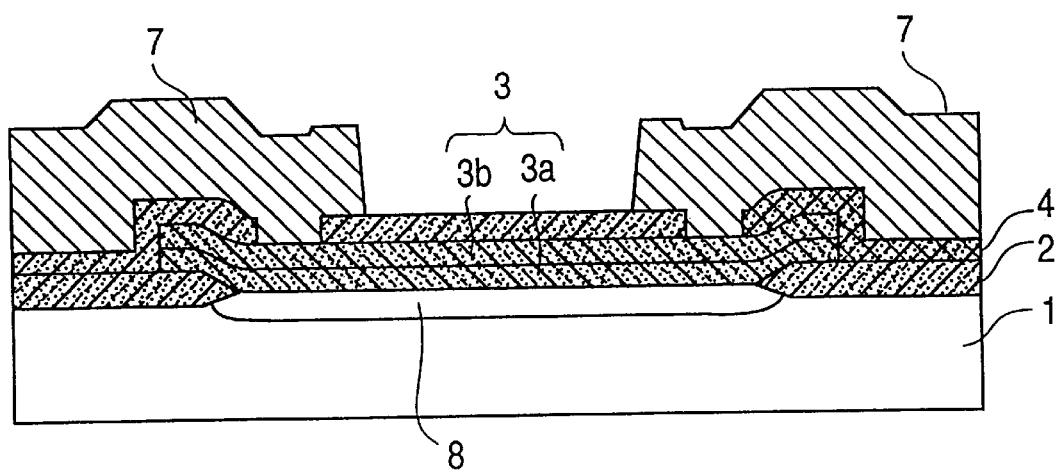
FIG. 7 is a sectional view of a resistor according to the seventh embodiment of the present invention.

Referring to FIG. 7, Embodiment 7 will be described. A resistor of FIG. 7 according to the present invention includes an impurity region 8 provided in the semiconductor substrate, the impurity region being opposite in conductivity to that of the substrate, and the polycrystalline silicon layer 3 is opposite in temperature dependence of resistance to that of the impurity region, so that the temperature dependence of resistance is improved by the parallel resistance circuit thus formed. Since the conventional structure employs either single crystal silicon or polycrystalline silicon as material for a resistor, it is disadvantageous in that, if impurity concentration is lowered to obtain high resistance, the resistance value will sharply fluctuate.

As shown in FIG. 7, resistor layers (and regions) different in temperature dependence are connected in parallel, whereby a resistor having less temperature dependence can be formed. The diffused resistor region formed in the single crystal silicon substrate normally has positive temperature dependence at the normal temperature (room temperature), whereas it has negative temperature dependence at temperatures lower than the former. On the other hand, the polycrystalline silicon layer whose impurity concentration is at $1\times10^{19}$/cm$^3$ or less has negative temperature dependence. This means that a resistor having any desired temperature dependence can be made by connecting resistors different in temperature dependence in parallel in the intended operating temperature range, as shown in FIG. 7.

Figure 38:
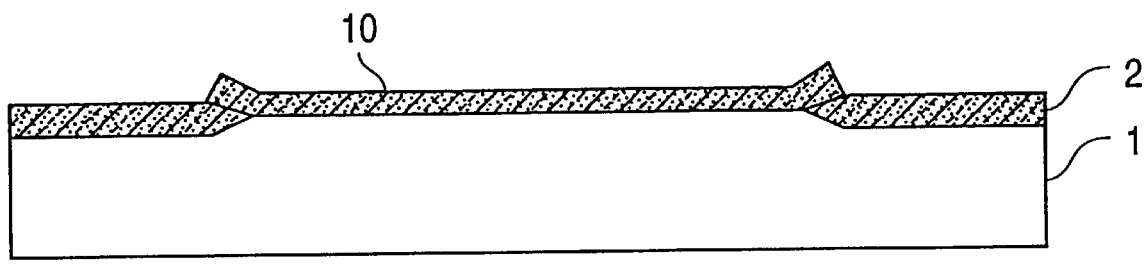
FIG. 38 is a sectional view of the resistor according to the seventh embodiment of the present invention, showing a process of manufacturing the same.
Figure 39:
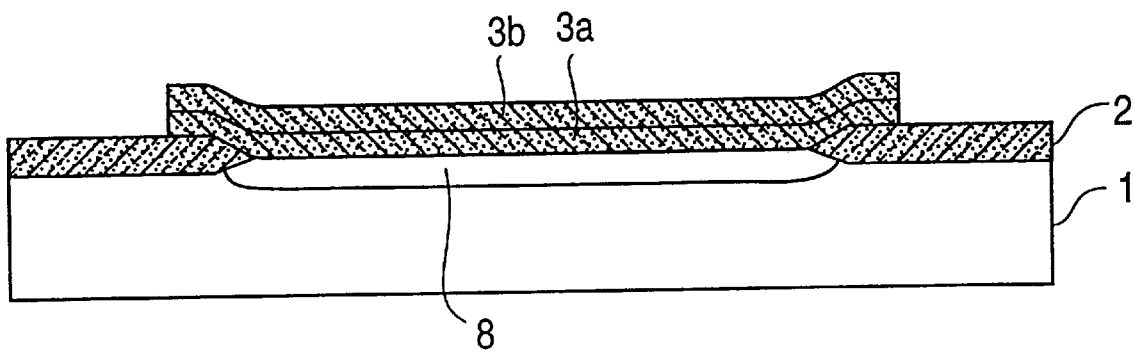
FIG. 39 is a sectional view of the resistor according to the seventh embodiment of the present invention, showing a process of manufacturing the same.
Figure 40:
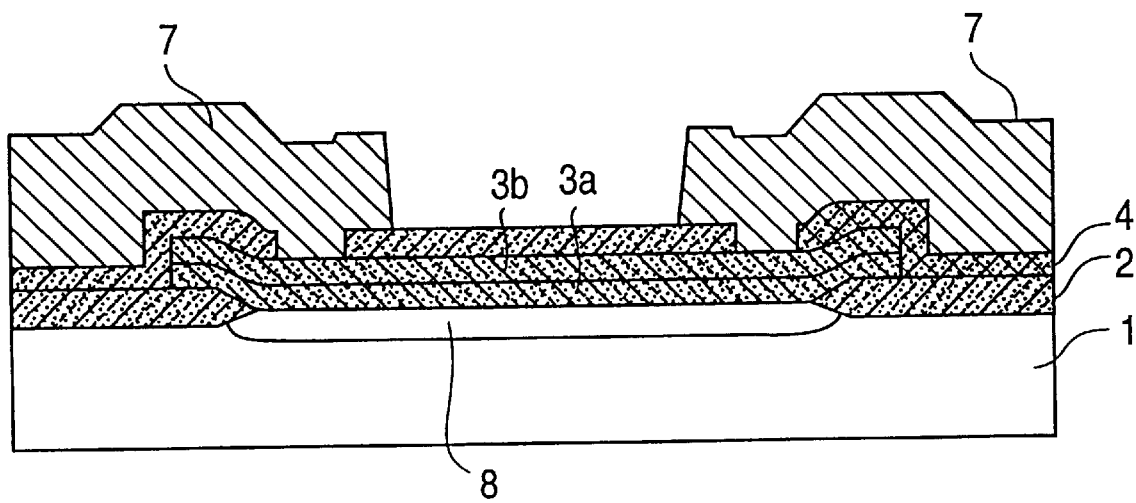
FIG. 40 is a sectional view of the resistor according to the seventh embodiment of the present, invention, showing a process of manufacturing the same.

FIGS. 38 to 40 illustrate a process of manufacturing a semiconductor device according to the present embodiment, showing process steps for forming the sectional structure of FIG. 7.

First, a silicon nitride film 10 is formed on the surface of an n-type silicon substrate 1. Then a silicon dioxide film 2 is provided by selective thermal oxidation, using the silicon nitride film 10 as a mask. Subsequently, a polycrystalline silicon film 3 is formed on the surface of the semiconductor substrate and on the silicon dioxide film 2. At this time, the deposition temperature of the polycrystalline silicon is set at 600° C. or higher, and a crystal structure of small grain size is formed. Then high dose of ion implantation is implemented to carry out simultaneously the injection of impurities into the polycrystalline silicon film and making amorphous a surface portion of the polycrystalline silicon film. When the polycrystalline silicon film is 0.1 μm thick, for example, boron ions as p-type impurities are implanted under the conditions of an acceleration energy of 10 keV and a dose of $1 \times 10^{16}/cm^2$. Then heat treatment is made to effect recrystallization of the amorphous film and to diffuse impurities from the polycrystalline silicon into a single crystal silicon, so that the p-type diffusion region 8 is simultaneously formed. Then the polycrystalline silicon film is subjected to patterning (FIG. 39), then the silicon dioxide layer 4 is formed and the known photoetching technique is then used to form contact holes in the silicon oxide film 4 so as to expose the polycrystalline silicon layer. Then the Al electrode 7 is formed in such a manner as to contact the polycrystalline silicon film via the contact holes, to obtain a semiconductor device having an arbitrary temperature characteristic of the resistance, as shown in FIG. 7 (or FIG. 40). Even though a diffusion region 8 is formed before the polycrystalline silicon layer 3 is formed, the same structure will needless to say be attained.

EMBODIMENT 8

Figure 8:
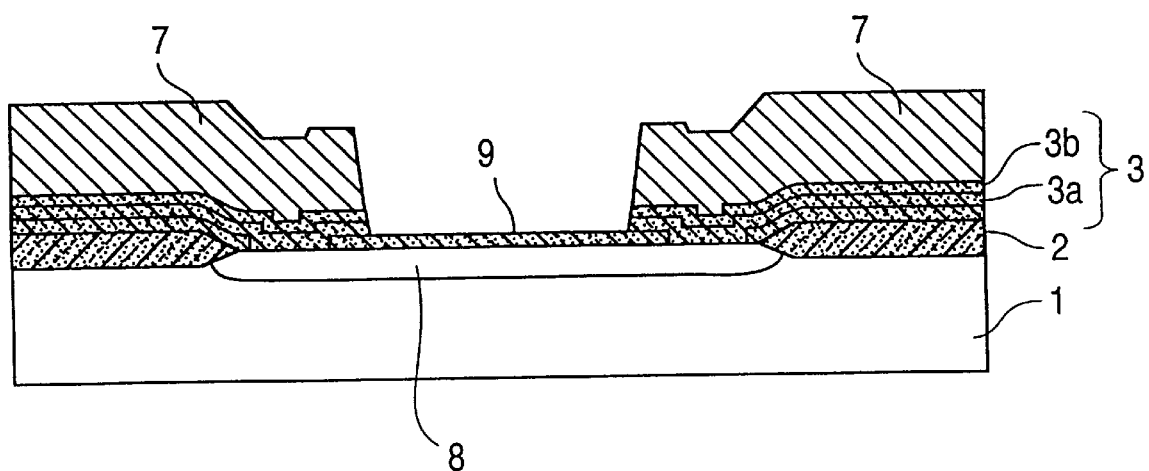
FIG. 8 is a sectional view of a resistor according to the eighth embodiment of the present invention.

Embodiment 8, shown in FIG. 8, improves temperature dependence of resistance in a semiconductor device by providing a polycrystalline silicon layer between an impurity region within a semiconductor substrate and an upper electrode. Thus, in FIG. 8, an n-type diffusion region 8 is provided with polycrystalline silicon layers 3a, 3b electrically connected to opposed ends of the diffusion region 8. Al electrodes 7,7 are in electrical contact with the polycrystalline silicon layers 3b. As seen in FIG. 8, polycrystalline silicon layers 3a, 3b are electrically connected in series with n-type diffusion region 8.

Figure 41:
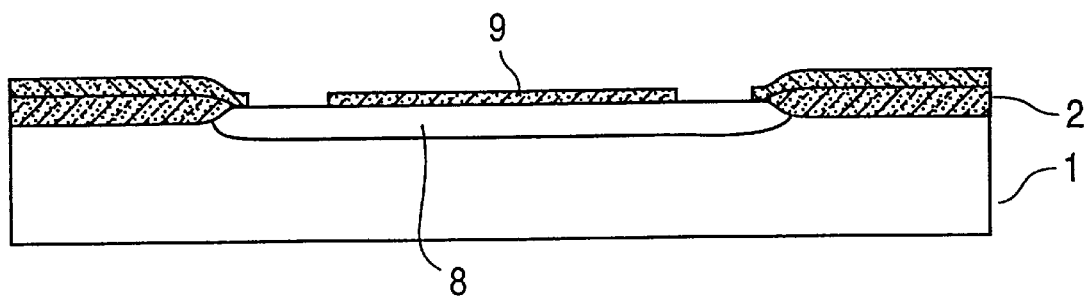
FIG. 41 is a sectional view of the resistor according to the eighth embodiment of the present invention, showing a process of manufacturing the same.
Figure 42:
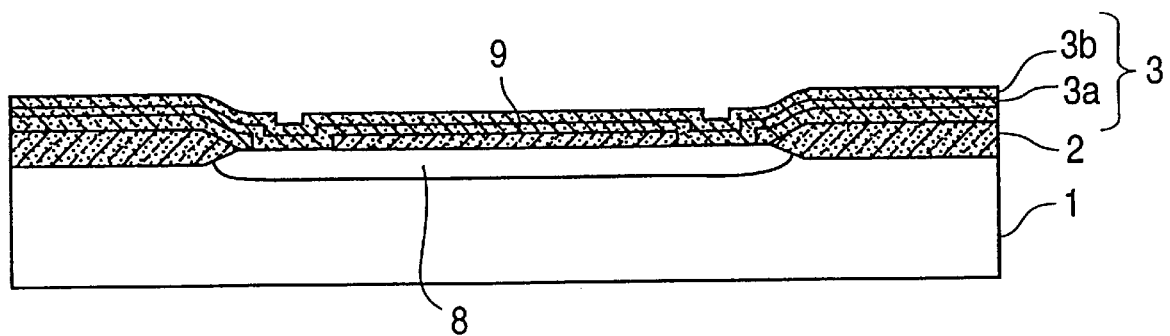
FIG. 42 is a sectional view of the resistor according to the eighth embodiment of the present invention, showing a process of manufacturing the same.
Figure 43:
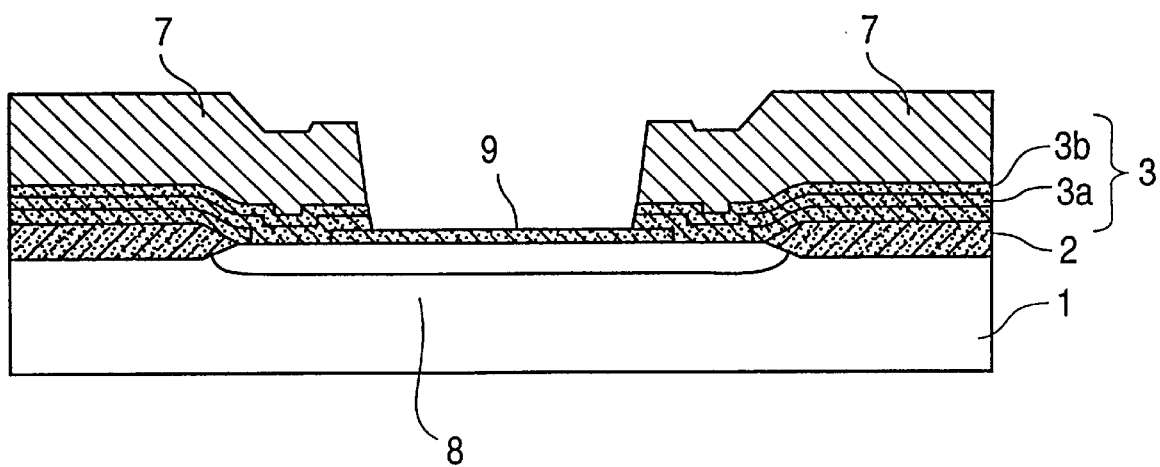
FIG. 43 is a sectional view of the resistor according to the eighth embodiment of the present invention, showing a process of manufacturing the same.

Referring to FIGS. 41 to 43 as well as drawing numbers, a description will subsequently be given of a process of manufacturing the semiconductor device according to the present embodiment.

First, a silicon dioxide film 2 is formed in a desired portion of an n-type silicon substrate 1. Then, a p-type diffusion region 8 is formed by diffusing boron as p-type impurities from the surface of the substrate, and further a silicon dioxide layer 9 is provided on the surface of the diffusion region 8 (FIG. 41). Subsequently, the same method as in Embodiment 1 is used to provide the polycrystalline silicon film 3 on the surface of the substrate and on silicon dioxide layer 9, and to implant boron ions as a p-type diffusion layer, so that part of the polycrystalline silicon is made to be amorphous. Then heat treatment is made at 600° C. or higher to grow a polycrystalline layer, in a surface layer of the polycrystalline silicon, of large grain size (FIG. 42). An Al film is then formed on the polycrystalline silicon film 3. Then, known photoetching and dry etching techniques are used to subject the polycrystalline silicon film 3 and the Al film to patterning to obtain the semiconductor device of FIG. 8 (or FIG. 43) having a desired temperature dependence of resistance. The same effect will be achievable even though the method of Embodiment 2 is used to form the polycrystalline silicon film according to the present embodiment. Further, the same effect will also be obtained even though the crystal structure of the polycrystalline silicon is turned upside down so as to reduce the contact resistance between the metal electrode and the polycrystalline silicon.

EMBODIMENT 9

Figure 9:
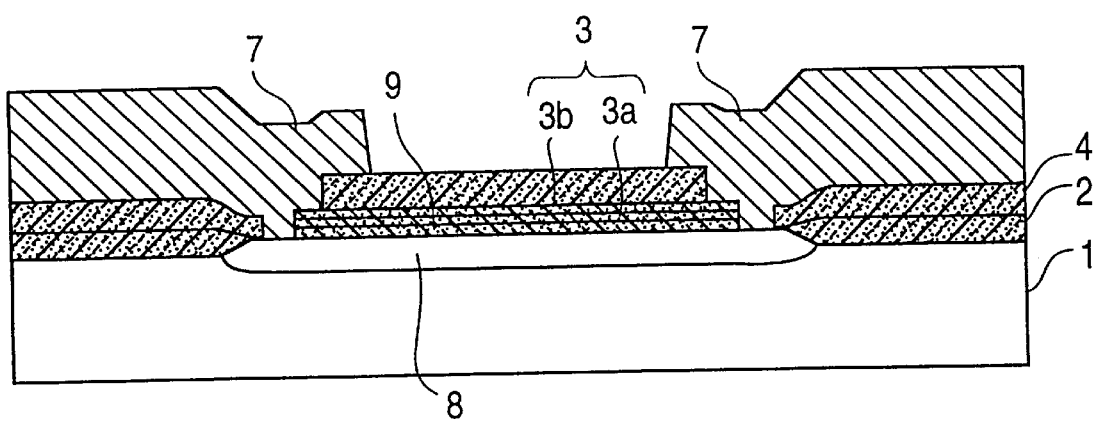
FIG. 9 is a sectional view of a resistor according to the ninth embodiment of the present invention.

Embodiment 9, shown in FIG. 9, is illustrative of a resistor having an impurity region 8 and the polycrystalline silicon film 3, by providing a dielectric film 9 between the impurity region 8 and the polycrystalline silicon film 3. The resistor has p-type diffusion region 8 and polycrystalline silicon layers 3a, 3b, and wherein Al electrodes 7,7 respectively contact ends of the polycrystalline silicon layers and of the diffusion region 8.

Figure 44:
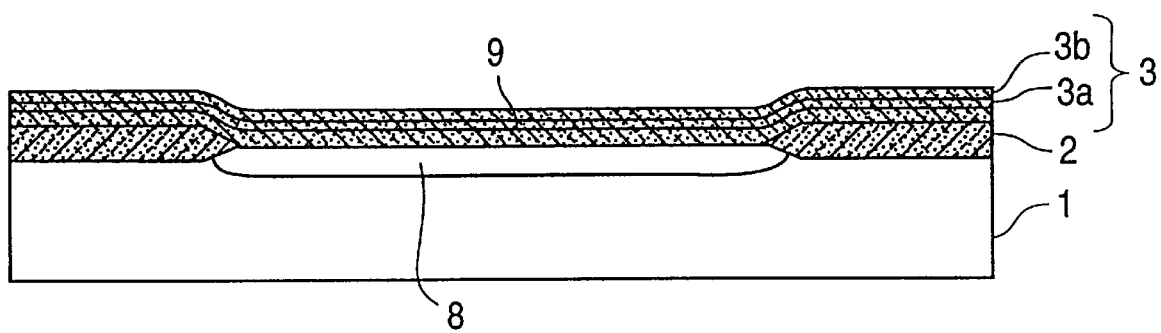
FIG. 44 is a sectional view of the resistor according to the ninth embodiment of the present invention, showing a process of manufacturing the same.
Figure 45:
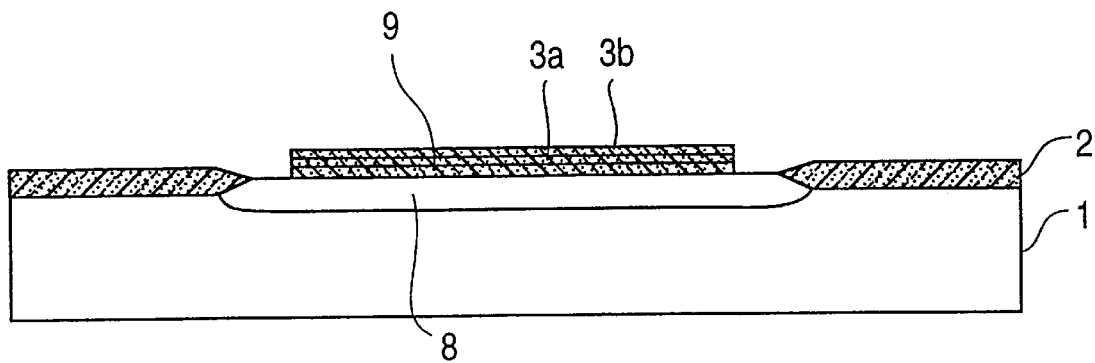
FIG. 45 is a sectional view of the resistor according to the ninth embodiment of the present invention, showing a process of manufacturing the same.
Figure 46:
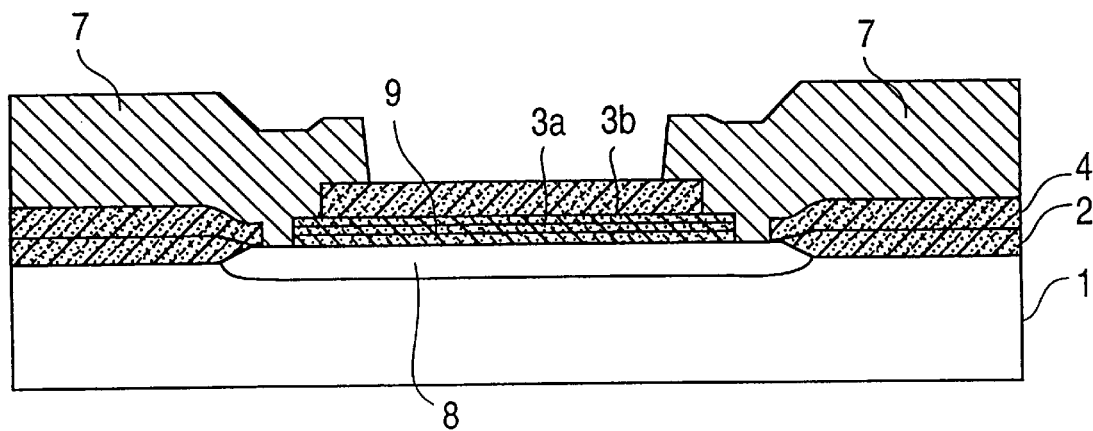
FIG. 46 is a sectional view of the resistor according to the ninth embodiment of the present invention, showing a process of manufacturing the same.

Referring to FIGS. 44 to 46 as well as drawing numbers, a description will subsequently be given of a process of manufacturing the resistor according to the present embodiment.

First, a silicon dioxide film 2 is formed in a desired portion of an n-type silicon substrate 1. Then the p-type diffusion region 8 is formed by diffusing boron as p-type impurities from the surface of the substrate; and further a silicon dioxide layer 9 is provided on the surface of the semiconductor substrate on the diffusion region 8. Subsequently, under the same condition as in Embodiment 1, a polycrystalline silicon film 3 is provided on the surface of the substrate, and boron ions as a p-type impurity is implanted and further heat treatment is made (FIG. 44), so as to form polycrystalline silicon layers 3a, 3b. Then, a known photoetching technique is used to subject the polycrystalline silicon layers 3a, 3b and the silicon dioxide layer 9 to patterning (FIG. 45). Moreover, a silicon dioxide layer 4 is formed on the surface of the semiconductor substrate and on polycrystalline silicon layer 3b, and contact holes are formed in the silicon dioxide layer 4 so as to expose the polycrystalline silicon layer 3b and the p-type diffusion region (FIG. 46). Then, an Al electrode 7 is formed in such a manner as to contact the diffusion region 8 and polycrystalline silicon layers 3a, 3b via the contact holes to obtain a semiconductor device having any desired polycrystalline silicon layer resistance, as shown in FIG. 9 (or FIG. 46), and any desired temperature dependence of resistance. The same effect will, needless to say, be achievable even though the conductivity type of the single crystal silicon impurity diffusion region and that of the impurities of the polycrystalline silicon do not necessarily conform to each other, according to the present embodiment.

EMBODIMENT 10

Figure 10:
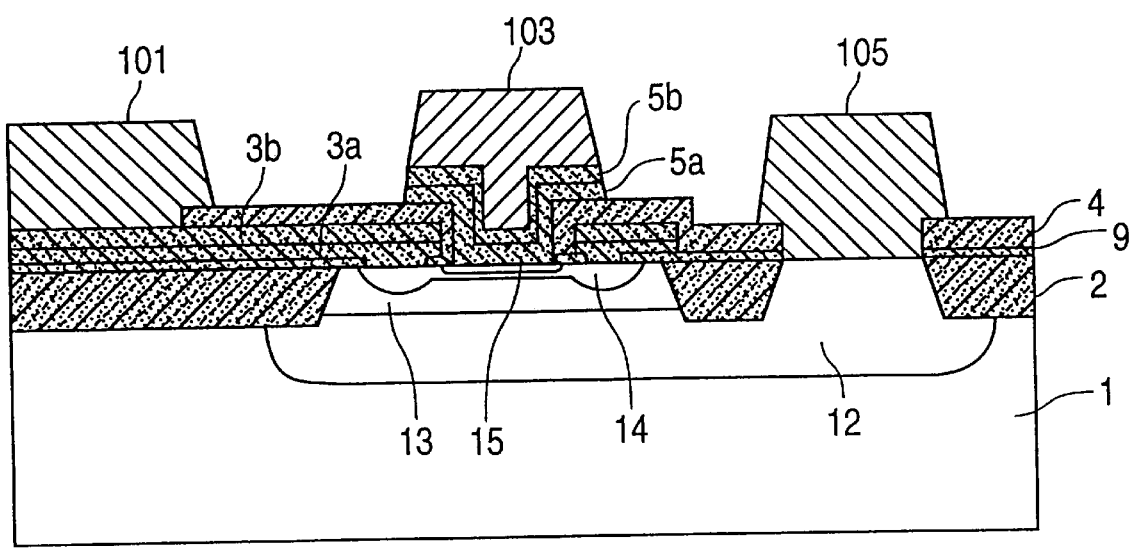
FIG. 10 is a sectional view of a semiconductor device according to the tenth embodiment of the present invention.

Referring to FIG. 10, Embodiment 10 according to the present invention will be described. FIG. 10 is a sectional view of a semiconductor device having a bipolar transistor with lead-out electrodes (e.g., having a resistance) according to the present invention.

FIG. 10 shows a bipolar transistor using base and emitter lead-out electrodes according to the present invention. Numerals 12 and 13 designate regions constituting the collector, while 14 and 15 respectively designate the base and emitter, of the bipolar transistor. Polycrystalline silicon layers 3a and 3b constitute the base lead-out electrode, and polycrystalline silicon layers 5a and 5b constitute the emitter lead-out electrode. Numerals 101, 103 and 105 respectively denote the base, emitter and collector electrodes, respectively in electrical connection with the base lead-out electrode, emitter lead-out electrode and collector region.

In Embodiment 10, polycrystalline silicon whose temperature dependence is almost zero is used for the base and emitter lead-out electrodes of such a bipolar transistor. In other words, use has heretofore been made of lead-out electrodes made of polycrystalline silicon or any other material apart from the polycrystalline silicon used for the electrode of the transistor, and which combines these materials to improve temperature dependence of resistance. For this reason, an increase in the number of process steps and the area occupied thereby has been unavoidable. According to the methods exemplified in Embodiments 1 to 3, it is possible to obtain polycrystalline silicon films 3a, 3b excellent in not only electrical precision but also temperature dependence, which makes it also possible to acquire a precise, extremely small integrated circuit using such a polycrystalline silicon film as the lead-out electrodes of a bipolar transistor.

With a polycrystalline silicon film having a positive temperature dependence as the lead-out electrodes of a bipolar transistor, an additional effect is made available. If a laminated polycrystalline silicon film with 3a, 3b and 5a, 5b, having such a temperature dependence as to decrease the resistivity to the maximum extent at the operating temperature of an integrated circuit, is used for the emitter or base lead-out electrodes of the bipolar transistor, the emitter or base resistance may be lowered with the result of improving the performance of the element and further the circuit involved.

Figure 47:
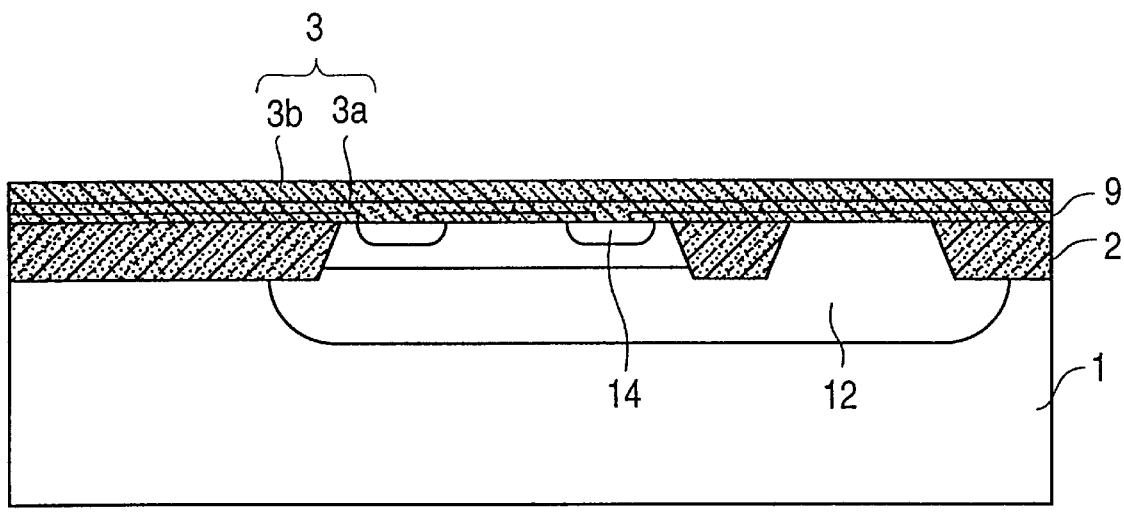
FIG. 47 is a sectional view of the resistor according to the tenth embodiment of the present invention, showing a process of manufacturing the same.
Figure 48:
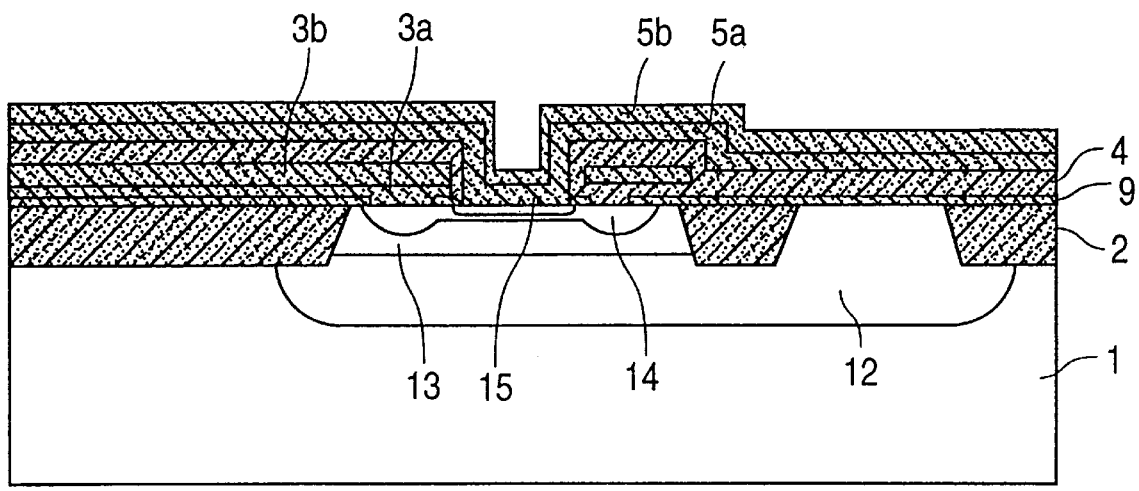
FIG. 48 is a sectional view of the resistor according to the tenth embodiment of the present invention, showing a process of manufacturing the same.
Figure 49:
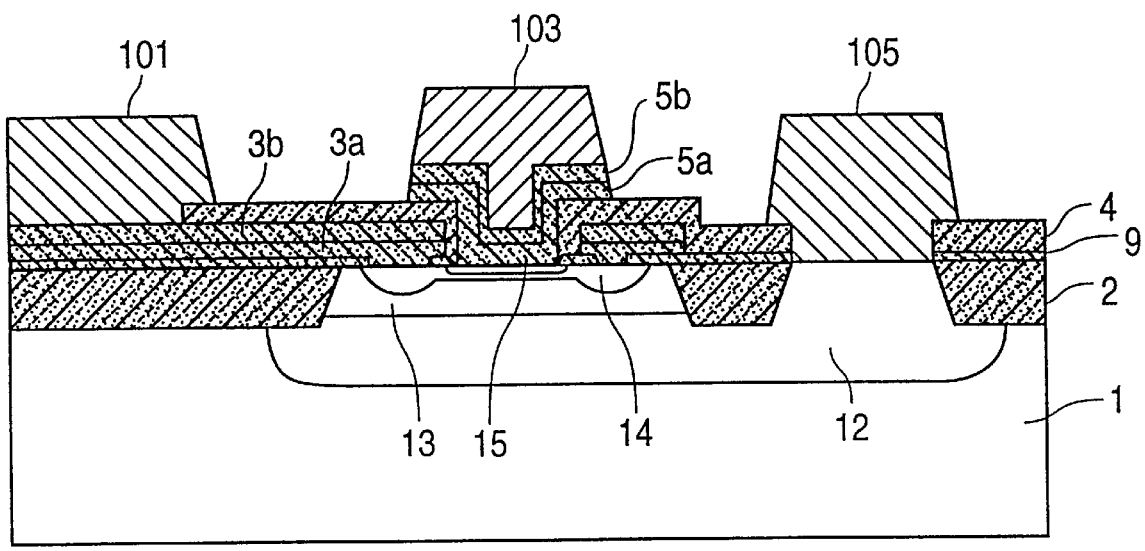
FIG. 49 is a sectional view of the resistor according to the tenth embodiment of the present invention, showing a process of manufacturing the same.

Referring to FIGS. 47 to 49 as well as drawing numbers, a description will subsequently be given of a process of manufacturing the semiconductor device according to the present embodiment.

First, an n-type diffusion region 12 is provided in a desired portion of a p-type silicon substrate 1, and an n-type epitaxial layer 13 is grown subsequently. Then a silicon dioxide film 2 is provided by selective oxidation so as to form an embossed silicon area. On that surface lies the silicon dioxide film 9, and part of the silicon dioxide is opened by means of known photoetching techniques to expose the silicon substrate. Then the polycrystalline silicon film 3 is formed on the surface of the substrate. At this time, the deposition temperature of the polycrystalline silicon is set at 600° C. or higher and a crystal structure of small grain size is acquired. Then high dose ion implantation is implemented to carry out simultaneously the injection of impurities into the polycrystalline silicon film 3 and making amorphous the polycrystalline silicon film. When the polycrystalline silicon film 3 is 0.2 μm thick, for example, boron ions as p-type impurities are implanted under the conditions of an acceleration energy of 20 keV and a dose of 1×10$^{16}$/cm$^2$. Then heat treatment is made to effect recrystallization of the amorphous film to form the polycrystalline silicon films 3a, 3b, having a smaller grain size and a larger grain size, respectively, and simultaneously to diffuse impurities from the polycrystalline silicon film into the single crystal silicon substrate, so that a p-type diffusion layer 14 is formed (FIG. 47). Subsequently, the known photoetching technique is used to remove part of the polycrystalline silicon film 3. Then, boron ions, as p-type impurities, are implanted into the single-crystal silicon substrate. Subsequently, a heat treatment is conducted to diffuse the implanted impurities and to activate the impurities, so as to form an intrinsic base region. Then the silicon dioxide film 4 is formed on the polycrystalline silicon. Subsequently, a portion to be used as an emitter opening in the silicon dioxide films 9, 4 is etched.

Then a polycrystalline silicon film 5a is formed overlying the surface of the semiconductor substrate. At this time, the deposition temperature of the polycrystalline silicon is set at 600° C. or higher, to provide a crystal structure of small grain size. Then phosphorous as n-type impurities is diffused from the surface of the polycrystalline silicon film 5a, and the surface of the polycrystalline silicon film 5a is oxidized in the atmosphere. At this time, the thickness of the oxide film is reduced to the extent that electric conduction is not impaired (e.g., 1 nm thick or greater to prevent crystallinity from being affected and 4 nm thick or less to facilitate the flow of tunnel current). Then, a polycrystalline silicon film 5b is deposited at a deposition temperature of as low as 550° C. or lower, for example, and phosphorous as n-type impurities are diffused again and doped. The polycrystalline silicon film 5b of large grain size is thus obtained by rendering the grain size gigantic (FIG. 48). In this case, ion injection may be employed for the injection of impurities into the polycrystalline silicon film, or impurities may be added to the deposition gas. Then, known photoetching techniques are used to selectively etch the polycrystalline silicon layers 5a, 5b and the silicon dioxide film 4 to form base and collector electrode holes. Then, an Al electrode is formed to obtain a bipolar transistor as shown in FIG. 10 (or FIG. 49). This bipolar transistor includes lead-out electrodes having a resistance (e.g., acting as a resistor) which is excellent in temperature dependence of resistance (e.g., the resistance can be made substantially independent of temperature).

According to the present invention, even though the n- and p-type conductivity is completely inverted, even though part of the polycrystalline silicon layer is replaced with a polycide (or silicide) layer, even though the crystal structure of the polycrystalline silicon is turned upside down, and further, even though the bipolar transistor referred to in the present embodiment is replaced with any other active element (e.g., MOS transistor), the same effect will needless to say be achievable.

EMBODIMENT 11

Figure 11:
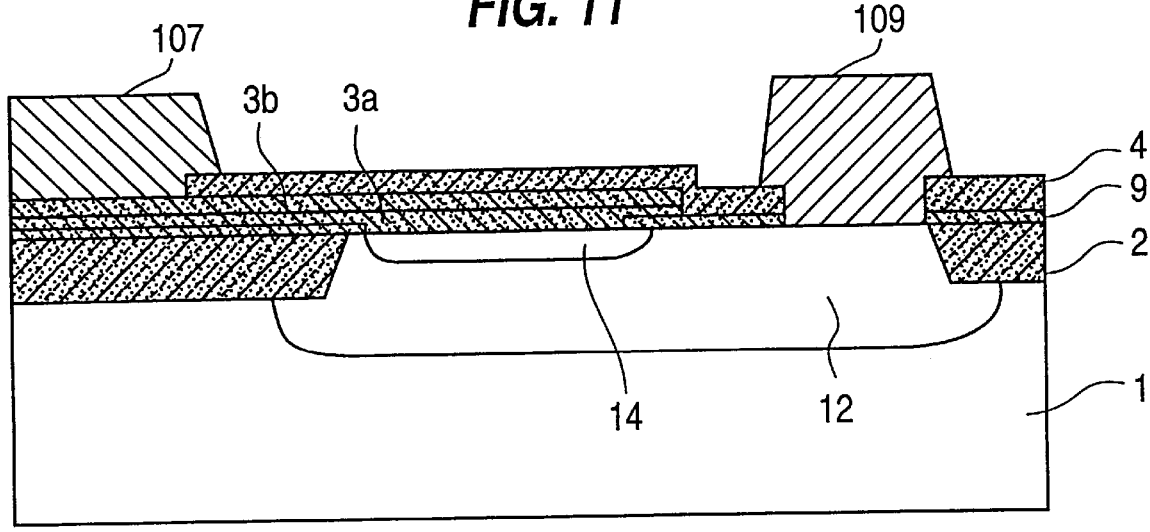
FIG. 11 is a sectional view of a semiconductor device according to the eleventh embodiment of the present invention.

Referring to FIG. 11, Embodiment 11 will be described. FIG. 11 is a sectional view of a diode having a lead-out electrode (e.g., a resistor) embodying the present invention. The diode includes n-type diffusion region 12 formed in p-type silicon substrate 1, p-type diffusion region 14 formed in the n-type diffusion region 12, and anode 107 and cathode 109 respectively in electrical contact with the regions 14 and 12, the anode being in electrical connection via the lead-out electrode 3a, 3b. The lead-out electrode of the diode is formed with the polycrystalline silicon films 3a, 3b having any desired temperature dependence. Heretofore, an element having a resistance, made of polycrystalline silicon or any other material other than polycrystalline silicon, for use as the lead-out electrode of a diode, and which combines these materials, has been formed to improve the temperature dependence of the lead-out electrode. However, an increase in the number of process steps, and in the area occupied by the lead-out electrode, has been unavoidable. According to the methods exemplified in Embodiment 11, it is possible to obtain polycrystalline silicon films 3a, 3b having any desired temperature dependence, which makes it also possible to acquire an extremely small, stable integrated circuit, stable against temperature fluctuation using such polycrystalline silicon films as a lead-out electrode of the diode.

Figure 50:
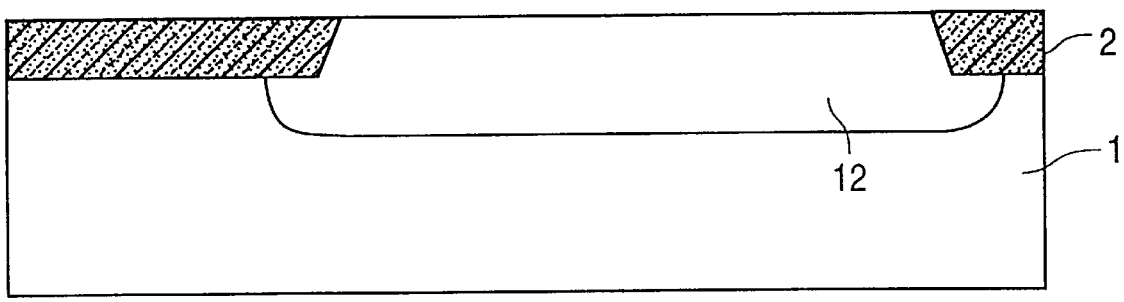
FIG. 50 is a sectional view of the resistor according to the eleventh embodiment of the present invention, showing a process of manufacturing the same.
Figure 51:
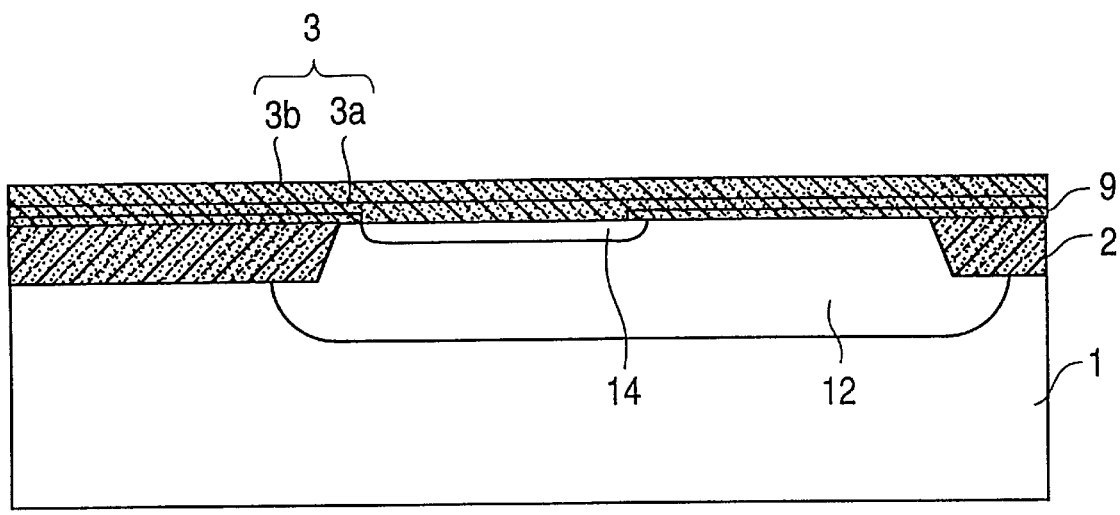
FIG. 51 is a sectional view of the resistor according to the eleventh embodiment of the present invention, showing a process of manufacturing the same.
Figure 52:
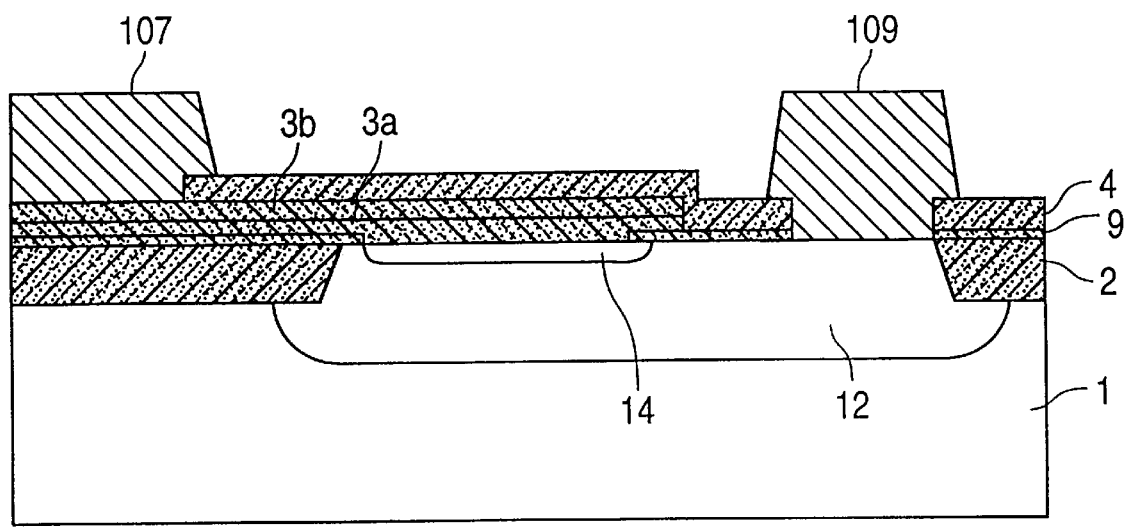
FIG. 52 is a sectional view of the resistor according to the eleventh embodiment of the present invention, showing a process of manufacturing the same.

Referring to FIGS. 50 to 52 as well as drawing numbers, a description will subsequently be given of a process of manufacturing the semiconductor device according to the present embodiment.

First, an n-type diffusion region 12 is provided in a desired portion of the p-type silicon substrate 1. Then a silicon dioxide film 2 is provided by selective oxidation, so as to form an embossed silicon area (FIG. 50). A silicon dioxide film 9 is provided on that surface, and known photoetching techniques are used to open part of the silicon dioxide film 9 so as to expose the silicon (i.e., expose region 12). Then the polycrystalline silicon film 3 is formed on the surface of the substrate. At this time, the deposition temperature of the polycrystalline silicon is set at 600° C. or higher to acquire a crystal structure of small grain size. Then high dose of ion implantation is implemented to carry out simultaneously the injection of impurities into the polycrystalline silicon and making amorphous a partial thickness of the polycrystalline silicon 3. When the polycrystalline silicon film is 0.1 µm thick, for example, boron ions as p-type impurities are implanted under the conditions of an acceleration energy of 10 keV and a dose at $8 \times 10^{15}/cm^2$.

Then heat treatment is performed to effect recrystallization of the noncrystalline film to form the polycrystalline silicon films 3a, 3b and simultaneously to diffuse impurities from the polycrystalline silicon film into the single crystal silicon substrate, so that the p-type diffusion layer 14 is formed (FIG. 51). Subsequently, known photoetching techniques are used to remove part of the polycrystalline silicon film 3. Then the silicon dioxide film 4 is formed on the polycrystalline silicon. Then known photoetching techniques are used to selectively etch the silicon dioxide film 4 to form an anode electrode hole and a cathode electrode hole. Then, Al electrodes are formed to acquire a diode excellent in temperature dependence as shown in FIG. 11 (or FIG. 52). According to the present embodiment, even though the n- and p-type conductivity is completely inverted, even though the crystal structure of the polycrystalline silicon is turned upside down, and further even though part of the polycrystalline silicon layer is replaced with a polycide (or silicide) layer, the same effect will, needless to say, be achievable.

EMBODIMENT 12

Figure 12:
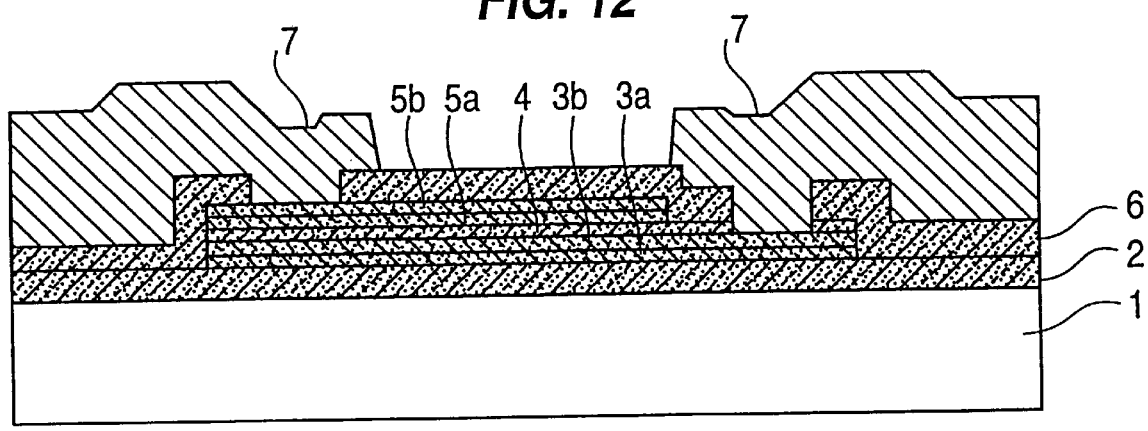
FIG. 12 is a sectional view of a semiconductor device according to the twelfth embodiment of the present invention.

Referring to FIG. 12, Embodiment 12 will be described. FIG. 12 is a sectional view of a capacitor having electrodes embodying the present invention; these electrodes can simultaneously act as electrodes of the capacitor and resistors of an integrated circuit containing the capacitor. Illustrative of such an integrated circuit is a combination of capacitor and resistor to make time constant, in a large-scale integrated circuit. The electrodes of the capacitor are formed with polycrystalline silicon films having any desired temperature dependence (e.g., wherein the films form resistors substantially independent of temperature). By improving the temperature dependence of the polycrystalline silicon for use as the electrodes, it becomes possible to obtain a stable circuit against temperature fluctuation. More specifically, time constant fluctuation due to temperature fluctuation is made preventable, where the resistance of the electrodes is made substantially independent of temperature over a wide range of temperatures, without increasing the area occupied, whereby an integrated circuit is usable in a temperature range wider than before.

In FIG. 12, the polycrystalline silicon film formed of polycrystalline silicon layers 3a, 3b, respectively having smaller and larger grain sizes, forms one electrode of the capacitor. Silicon dioxide film 4 forms the dielectric of the capacitor, and the polycrystalline silicon film formed by polycrystalline silicon layers 5a, 5b, respectively having smaller and larger grain sizes, forms the other electrode of the capacitor. Numeral 7 denotes aluminum electrodes electrically connected to the electrodes of the capacitor.

Figure 53:
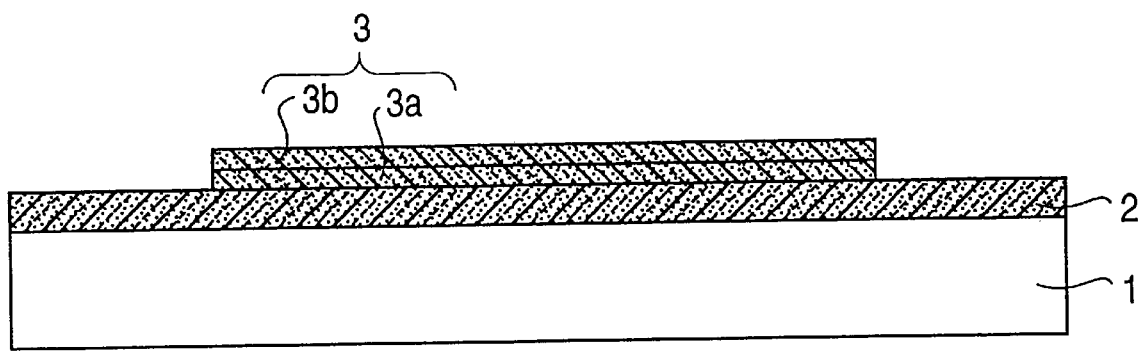
FIG. 53 is a sectional view of the resistor according to the twelfth embodiment of the present invention, showing a process of manufacturing the same.
Figure 54:
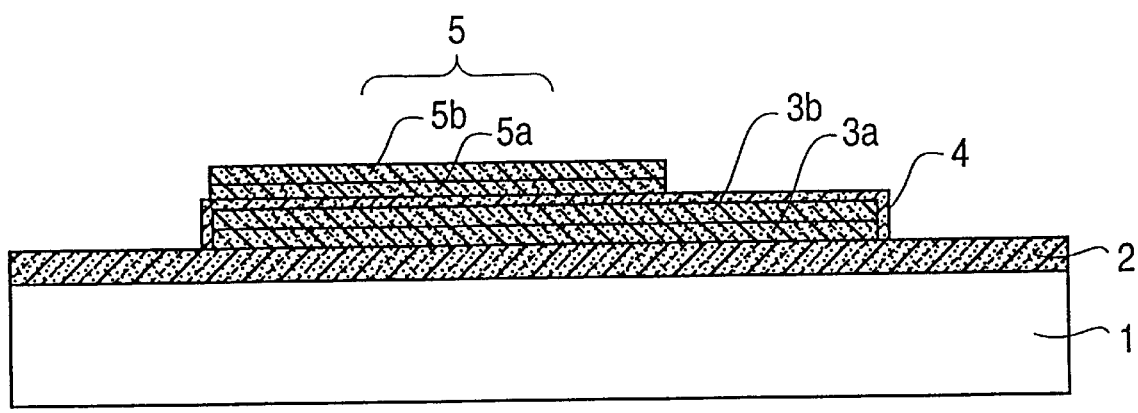
FIG. 54 is a sectional view of the resistor according to the twelfth embodiment of the present invention, showing a process of manufacturing the same.
Figure 55:
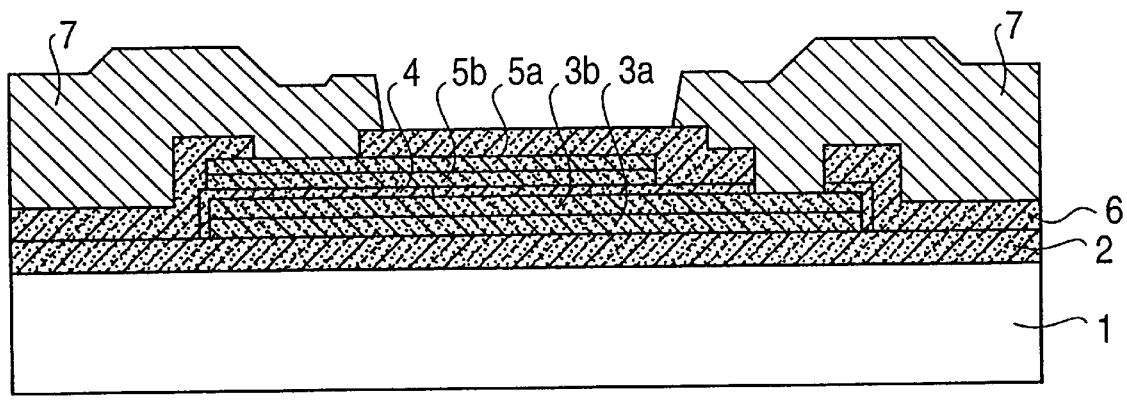
FIG. 55 is a sectional view of the resistor according to the twelfth embodiment of the present invention, showing a process of manufacturing the same.

Referring to FIGS. 53 to 55 as well as drawing numbers, a description will subsequently be given of a process of manufacturing the semiconductor device according to the present embodiment.

First, a silicon dioxide film 2 is provided on the p-type silicon substrate 1, and a polycrystalline silicon film 3 is formed thereon. At this time, the deposition temperature of the polycrystalline silicon is set at 600° C. or higher to acquire a crystal structure of small grain size. Then high dose of ion implantation is implemented to carry out simultaneously the injection of impurities into the polycrystalline silicon and making amorphous the polycrystalline silicon film. When the polycrystalline silicon film is 0.1 µm thick, for example, boron ions as p-type impurities are implanted under the conditions of an acceleration energy of 10 keV and a dose of $8 \times 10^{15}/cm^2$. Then heat treatment is performed to effect recrystallization of the amorphous film, to form the polycrystalline silicon layers 3a, 3b. Then, known photoetching techniques are used to remove part of the polycrystalline silicon film 3 (FIG. 53). Subsequently, a silicon dioxide film 4 is formed on the polycrystalline silicon, and known photoetching techniques are used to selectively etch the silicon dioxide film 4. Then, a polycrystalline silicon film 5 is provided over the whole surface of the substrate. Subsequently, the polycrystalline silicon layers 5a, 5b are formed in the same method as what is used to form the polycrystalline silicon layers 3a, 3b. Then known photoetching techniques are used to remove part of the polycrystalline silicon film 5 (FIG. 54). Subsequently, a silicon dioxide film 6 is formed on the polycrystalline silicon film 5, and known photoetching techniques are used to selectively etch the silicon dioxide film 6. Then, Al electrodes are formed to provide a capacitor excellent in temperature dependence of resistance (e.g., a capacitor whose electrodes have resistance that is substantially independent of temperature over the range of temperatures of use of the capacitor), as shown in FIG. 12 (or FIG. 55). According to the present embodiment, even though the method of Embodiment 2 is used for the formation of the polycrystalline silicon layers, even though the n- and p-type conductivity as well as the crystal structure of the polycrystalline silicon is inverted, and further even though part of the polycrystalline silicon layer is replaced with a polycide (or silicide) layer, the same effect will, needless to say, be achievable.

EMBODIMENT 13

Figure 57:
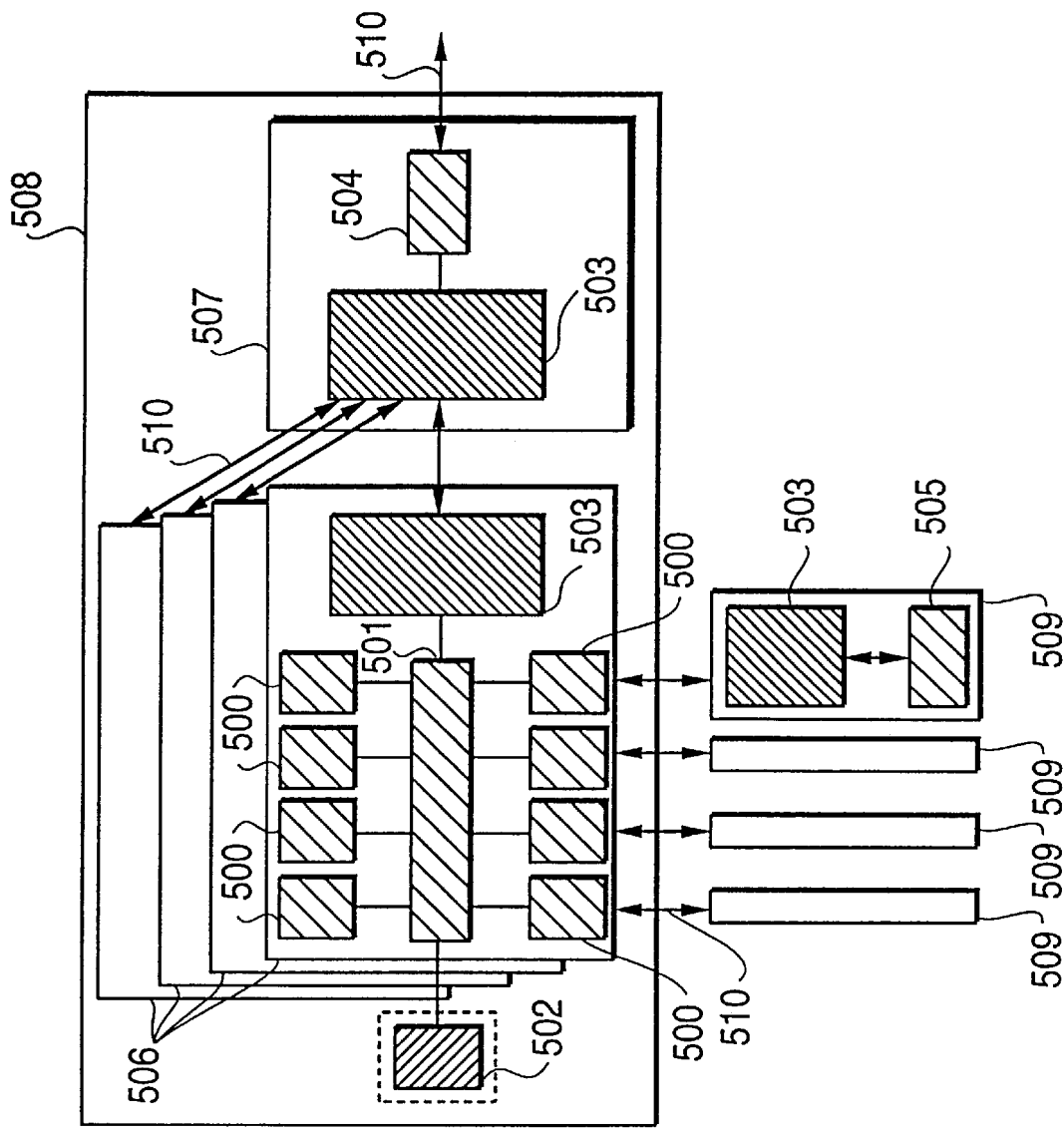
FIG. 57 is a schematic diagram illustrating a large-sized computer according to the thirteenth embodiment of the present invention, using semiconductor integrated circuitry having resistors according to the first to twelfth embodiments.

Referring to FIG. 57, Embodiment 13 will be described. FIG. 57 is a block diagram of a computer having a semiconductor integrated circuit including a resistor embodying the present invention. Embodiment 13 refers to a case where the silicon semiconductor integrated circuit using the polycrystalline silicon resistor according to the present invention is applied to a high-speed, large-sized computer to which a plurality of processors 500 for processing instructions and making calculations are connected together in parallel.

According to the present embodiment, the processors 500 for processing instructions and making calculations, a system control unit 501 and the main storage unit 502 can be integrated onto a silicon semiconductor chip with one side about 10–30 nm long. Moreover, the processors 500 for processing these instructions and making calculations, the system control unit 501 and a data interface communication interface 503 including the high-speed silicon semiconductor integrated circuit implemented by the present invention, and a semiconductor integrated circuit made of a compound semiconductor material, are packaged on a same ceramic substrate 506. Further, the data communication interface 503 and a data communication control unit interface 504 are packaged on a same ceramic substrate 507. A ceramic substrate loaded with these ceramic substrates 506, 507 and the main storage unit 502 is packaged on a substrate about 50 cm or less in size to form the central processing unit 508 in a large-sized computer. Data communication within the central processing unit 508, data communication among a plurality of central processing units, or data communications between the data communication interface 503 and a substrate 509 with a packaged input/output processor 505 is carried out via optical fibers 510 indicated by arrows on both ends.

In the case of this computer, silicon semiconductor integrated circuits in the processors 500 for processing instructions and making calculations, the system control unit 501, the main storage unit 502 and the like are operated at high speed in parallel. Since data communication has been carried out via optical media, moreover, the number of instructions processed per second has been increased by a large margin. The resistors used in the semiconductor integrated circuit are rendered less fluctuating and have excellent temperature dependence, making possible stable high-speed computation in a wide range.

Since variations in the resistance and temperature dependence of resistance of polycrystalline silicon can be controlled and, preferably, minimized, the present invention has the effect of stabilizing the operating of large-scale integrated circuits (LSI) when it is applied thereto.

Resistors having not only less temperature dependence but also any desired temperature dependence, can be made by combining two or more than two kinds of resistance layers different in temperature dependence according to the present invention. It is therefore possible to provide semiconductor devices in which temperature compensation of a resistance value is readily made when the circuit therefor is designated.

Further, the present invention has the effect of not solely lowering the parasitic resistance of transistors, diodes, capacitances and the like but improving their performance.

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

We claim:

1. A process of producing a semiconductor device, comprising the steps of:

forming a first polycrystalline silicon layer overlying a silicon oxide layer, forming an oxide film on said first polycrystalline silicon layer, said oxide film having a thickness such that tunnel current can flow therethrough; and forming a second polycrystalline silicon layer on said oxide film, the second polycrystalline silicon layer being thicker than the first polycrystalline silicon layer.

2. The process of producing a semiconductor device according to claim 1, wherein said thickness of the oxide film is in a range between 1 and 4 nm.

3. The process of producing a semiconductor device according to claim 1, wherein crystal grains of the first and second polycrystalline silicon layers have different grain sizes.

4. The process of producing a semiconductor device according to claim 1, wherein the first and second polycrystalline silicon layers are doped with an n-type impurity.

5. A process of producing a semiconductor device, comprising the steps of:

forming a first polycrystalline silicon layer overlying a silicon oxide layer;

forming an oxide film on said first polycrystalline silicon layer, said oxide film having a thickness such that tunnel current can flow therethrough; and forming a second polycrystalline silicon layer on said oxide film, the second polycrystalline silicon layer being thicker than the first polycrystalline silicon layer and having a larger average grain size than that of the first polycrystalline silicon layer.

6. A process of producing a semiconductor device, comprising the steps of:

forming a first polycrystalline silicon layer overlying a silicon oxide layer;

forming an oxide film on said first polycrystalline silicon layer, said oxide film having a thickness such that tunnel current can flow therethrough; and forming a second polycrystalline silicon layer on said oxide film, the second polycrystalline silicon layer being thicker than the first polycrystalline silicon layer and having a larger concentration of doped impurity than that of the first polycrystalline silicon layer.

7. A process of producing a semiconductor device, comprising the steps of:

forming a first polycrystalline silicon layer overlying a silicon oxide layer;

forming an oxide film on said first polycrystalline silicon layer, said oxide film having a thickness such that tunnel current can flow therethrough; and forming a second polycrystalline silicon layer on said oxide film, the second polycrystalline silicon layer having a larger concentration of doped impurity than that of the first polycrystalline silicon layer.

8. A process of producing a semiconductor device, comprising the steps of:

forming a first polycrystalline silicon layer overlying a silicon oxide layer;

forming an oxide film on said first polycrystalline silicon layer, said oxide film having a thickness such that tunnel current can flow therethrough; and forming a second polycrystalline silicon layer on said oxide film, the second polycrystalline silicon layer being thicker than the first polycrystalline silicon layer, having a larger average grain size than that of the first polycrystalline silicon layer, and having a larger concentration of doped impurity than that of the first polycrystalline silicon layer.

9. A process of producing a semiconductor device, comprising the steps of:

forming a first polycrystalline silicon layer overlying a silicon oxide layer;

forming an oxide film on said first polycrystalline silicon layer, said oxide film having a thickness such that tunnel current can flow therethrough; and forming a second polycrystalline silicon layer on said oxide film, the second polycrystalline silicon layer having a larger average grain size than that of the first polycrystalline silicon layer.

10. A process of producing a semiconductor device, comprising the steps of:

forming a first polycrystalline silicon layer overlying a silicon oxide layer;

forming an oxide film on said first polycrystalline silicon layer, said oxide film having a thickness such that tunnel current can flow therethrough; and forming a second polycrystalline silicon layer on said oxide film, the second polycrystalline silicon layer having a larger average grain size than that of the first polycrystalline silicon layer and having a larger concentration of doped impurity than that of the first polycrystalline silicon layer.

* * * * *